(12) United States Patent
Kim et al.

(10) Patent No.: US 10,147,650 B2
(45) Date of Patent: Dec. 4, 2018

(54) SEMICONDUCTOR DEVICES HAVING FIN-TYPE PATTERNS AND METAL CONTACTS AND METHODS OF MANUFACTURING THE SAME

(71) Applicant: Samsung Electronics Co., Ltd., Suwon-si, Gyeonggi-do (KR)

(72) Inventors: Sung-Min Kim, Incheon (KR); Ji-Su Kang, Seoul (KR); Byung-Chan Ryu, Seongnam-si (KR); Jae-Hyun Park, Osan-si (KR); Yu-Ri Lee, Suwon-si (KR); Dong-Ho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 15/211,200

(22) Filed: Jul. 15, 2016

(65) Prior Publication Data

US 2017/0018464 A1 Jan. 19, 2017

(30) Foreign Application Priority Data

Jul. 16, 2015 (KR) .......................... 10-2015-0100843

(51) Int. Cl.
| | |
|---|---|
| *H01L 21/70* | (2006.01) |
| *H01L 21/8238* | (2006.01) |
| *H01L 29/78* | (2006.01) |
| *H01L 29/08* | (2006.01) |
| *H01L 29/161* | (2006.01) |
| *H01L 29/16* | (2006.01) |
| *H01L 29/165* | (2006.01) |
| *H01L 27/092* | (2006.01) |

(52) U.S. Cl.
CPC ........... *H01L 21/823871* (2013.01); *H01L 21/823821* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/7848* (2013.01); *H01L 21/823814* (2013.01); *H01L 2029/7858* (2013.01)

(58) Field of Classification Search
CPC ............ H01L 29/66795; H01L 29/785; H01L 29/7848; H01L 29/41791; H01L 2029/7858; H01L 27/0886; H01L 27/0924; H01L 21/845; H01L 27/1211
USPC ................ 257/369, 401, E21.409, E29.255; 438/197, 283, 300
See application file for complete search history.

(56) References Cited

U.S. PATENT DOCUMENTS

| 8,143,114 B2 | 3/2012 | Yu et al. |
| 8,415,751 B2 | 4/2013 | Mukherjee et al. |
| 8,927,373 B2 | 1/2015 | Rodder et al. |

(Continued)

*Primary Examiner* — David Chen
(74) *Attorney, Agent, or Firm* — Myers Bigel, P.A.

(57) ABSTRACT

A semiconductor device includes a first fin-type pattern and a second fin-type pattern which protrude upwardly from an upper surface of a field insulating film and extend in a first direction. A gate structure intersects the first fin-type pattern and the second fin-type pattern. A first epitaxial layer is on the first fin-type pattern on at least one side of the gate structure, and a second epitaxial layer is on the second fin-type pattern on at least one side of the gate structure. A metal contact covers outer circumferential surfaces of the first epitaxial layer and the second epitaxial layer. The first epitaxial layer contacts the second epitaxial layer.

17 Claims, 34 Drawing Sheets

(56) References Cited

U.S. PATENT DOCUMENTS

| | | |
|---|---|---|
| 8,956,964 B2 | 2/2015 | Wang et al. |
| 9,305,916 B1* | 4/2016 | Cai .................... H01L 27/0285 |
| 9,379,025 B1* | 6/2016 | Basker ............ H01L 21/823821 |
| 2012/0049201 A1* | 3/2012 | Yamaguchi ..... H01L 21/823807 |
| | | 257/77 |
| 2014/0159159 A1 | 6/2014 | Steigerwald et al. |
| 2014/0203370 A1* | 7/2014 | Maeda .................. H01L 29/785 |
| | | 257/365 |
| 2014/0239395 A1 | 8/2014 | Basker et al. |
| 2014/0264279 A1* | 9/2014 | Cheng ................ H01L 29/7853 |
| | | 257/27 |
| 2014/0264482 A1* | 9/2014 | Li ..................... H01L 21/02532 |
| | | 257/288 |
| 2014/0273369 A1 | 9/2014 | Wei et al. |
| 2014/0306291 A1 | 10/2014 | Alptekin et al. |
| 2015/0037947 A1 | 2/2015 | Beaudoin et al. |
| 2015/0041908 A1 | 2/2015 | Adam et al. |
| 2015/0102422 A1 | 4/2015 | Cai et al. |
| 2015/0221654 A1* | 8/2015 | Kim ................ H01L 21/823878 |
| | | 257/77 |
| 2016/0086950 A1* | 3/2016 | Eom ............... H01L 21/823821 |
| | | 257/192 |
| 2016/0093741 A1* | 3/2016 | Yang .................. H01L 29/7853 |
| | | 257/288 |

* cited by examiner

SEMICONDUCTOR DEVICES HAVING FIN-TYPE PATTERNS AND METAL CONTACTS AND METHODS OF MANUFACTURING THE SAME

CROSS-REFERENCE TO RELATED APPLICATION

This application claims priority under 35 U.S.C. § 119 from Korean Patent Application No. 10-2015-0100843, filed on Jul. 16, 2015 in the Korean Intellectual Property Office, the entire contents of which is incorporated herein by reference.

BACKGROUND

One scaling technique for improving the density of a semiconductor device is the use of a multi-gate transistor in which a semiconductor fin is formed on a substrate and a gate is formed on a surface of the semiconductor fin. Since such a multi-gate transistor uses a three-dimensional channel, it is easy to perform scaling. Moreover, even if a gate length of the multi-gate transistor is not increased, the current control capability may be improved. Additionally, it is also possible to effectively suppress a short channel effect (SCE) in which the potential of the channel area is influenced by a drain voltage.

SUMMARY

An aspect of the inventive concepts provides a semiconductor device which may reduce the contact resistance and the contact size by forming the metal contact to wrap around source/drain areas.

Another aspect of the inventive concepts provides a method of manufacturing a semiconductor device capable of reducing the contact resistance and the contact size by forming a metal contact to wrap around the source/drain areas using a dummy epitaxial layer, without a silicide manufacturing process.

According to an aspect of the inventive concepts, there is provided a semiconductor device including a first fin-type pattern and a second fin-type pattern which protrude upwardly from an upper surface of a field insulating film, the first and second fin-type patterns each extending in a first direction, a gate structure that intersects the first fin-type pattern and the second fin-type pattern, a first epitaxial layer on the first fin-type pattern on at least one side of the gate structure, a second epitaxial layer on the second fin-type pattern on at least one side of the gate structure, and a metal contact which covers outer circumferential surfaces of the first epitaxial layer and the second epitaxial layer, wherein the first epitaxial layer contacts the second epitaxial layer.

In some embodiments, the metal contact comprises a first portion which contacts side walls of the gate structure, and a second portion which is spaced apart from the side walls of the gate structure on top of the first portion.

In some embodiments, at an interface between the first portion and the second portion, a width of the first portion is greater than a width of the second portion.

In some embodiments, the gate structure comprises a gate insulating film, a gate electrode on the gate insulating film, and a spacer on at least one side of the gate electrode, wherein the first portion is in contact with the spacer.

In some embodiments, a part of the second portion is located below an upper surface of the gate structure.

In some embodiments, a protruding space is provided between the field insulating film and the first and second epitaxial layers.

In some embodiments, the protruding space comprises an insulating material, a metal material or an air gap.

In some embodiments, an interlayer insulating film may be provided which covers the gate structure and the first and second epitaxial layers. The interlayer insulating film may contact a first area of the first and second epitaxial layers, and the metal contact may cover an outer surface of a second area of the first area of the first and second epitaxial layers.

In some embodiments, a third epitaxial layer may be provided which completely covers the outer circumferential surfaces of the first and second epitaxial layers, wherein the first and second epitaxial layers include the same material, and the third epitaxial layer comprises a material different from the first and second epitaxial layers.

According to another aspect of the inventive concepts, there is provided a semiconductor device including a substrate which includes a first area and a second area, a first fin-type pattern extending in a first direction on the first area, a second fin-type pattern extending in a second direction on the second area, a first gate structure which contacts the first fin-type pattern, the first gate structure extending in a third direction that intersects the first direction, a second gate structure which contacts the second fin-type pattern, the second gate structure extending in a fourth direction that intersects the second direction, a first epitaxial layer on the first fin-type pattern on at least one side of the first gate structure, a second epitaxial layer on the second fin-type pattern on at least one side of the second gate structure, a first metal contact which is on the first epitaxial layer and includes a first metal material, and a second metal contact which is on the second epitaxial layer and includes the first metal material, wherein the first metal contact completely surrounds an outer circumferential surface of the first epitaxial layer, and the second metal contact contacts only a part of an upper surface of the second epitaxial layer.

In some embodiments, the first metal contact may comprise a first portion which contacts side walls of the first gate structure, and a second portion which is spaced apart from the side walls of the first gate structure on top of the first portion.

In some embodiments, a width of the first portion may be greater than a width of the second portion at an interface between the first portion and the second portion.

In some embodiments, a lowermost surface of the second metal contact may be closer to an upper surface of the substrate than is an uppermost surface of the second epitaxial layer.

In some embodiments, a field insulating film may be provided on the substrate, wherein the first metal contact contacts the field insulating film, and the second metal contact does not directly contact the field insulating film.

In some embodiments, the lowermost surface of the first metal contact may be coplanar with the lowermost surface of the first epitaxial layer.

In some embodiments, the first area may comprise an NMOS transistor, and the second area may comprise a PMOS transistor.

In some embodiments, a first barrier metal may be provided which completely covers the outer circumferential surface of the first epitaxial layer, and a second barrier metal may be provided which is located only on a part of the second epitaxial layer.

In some embodiments, an area of the first barrier metal may be greater than an area of the second barrier metal.

In some embodiments, a first silicide layer may be provided which completely covers the outer circumferential surface of the first epitaxial layer, and a second silicide layer may be provided which is located only at the top of the second epitaxial layer.

In some embodiments, the first and second silicide layers may have different thicknesses.

In some embodiments, the first silicide layer may comprise a composition different from the second silicide layer.

In some embodiments, a third epitaxial layer may be provided which completely covers the outer circumferential surface of the second epitaxial layer, wherein the third epitaxial layer comprises a material different from the second epitaxial layer.

In some embodiments, the second metal contact may completely cover the outer circumferential surface of the third epitaxial layer.

According to still another aspect of the inventive concepts, there is provided a semiconductor device including a substrate which includes a first area and a second area, a first fin-type pattern extending in a first direction on the first area, a second fin-type pattern extending in a second direction on the second area, a first gate structure which is in contact with the first fin-type pattern and extends to intersect the first direction, a second gate structure which is contact with the second fin-type pattern and extends to intersect the second direction, a first epitaxial layer on the first fin-type pattern on at least one side of the first gate structure, a second epitaxial layer on the second fin-type pattern on at least one side of the second gate structure, a first metal contact which is on the first epitaxial layer and includes a metal, and a second metal contact which is on the second epitaxial layer and includes a metal, wherein the first metal contact includes a first portion which contacts side walls of the first gate structure, and a second portion which is spaced apart from the side walls of the first gate structure on top of the first portion.

In some embodiments, the gate structure may comprise a gate insulating film, a gate electrode on the gate insulating film, and a spacer on at least one side of the gate electrode, wherein the first portion contacts the spacer, and the second portion does not contact the spacer.

In some embodiments, the first portion may be in direct contact with the spacer or the first epitaxial layer.

In some embodiments, an interlayer insulating film may be provided which covers the gate structure and the first epitaxial layer, wherein the interlayer insulating film does not contact the first epitaxial layer.

In some embodiments, the first metal contact may completely surround the outer circumferential surface of the first epitaxial layer.

In some embodiments, a field insulating film may be provided on the substrate, and the first metal contact may contact the field insulating film.

In some embodiments, a third epitaxial layer may be provided which completely covers the outer circumferential surface of the first epitaxial layer, wherein the third epitaxial layer includes a material different from the first epitaxial layer.

According to still another aspect of the inventive concepts, there is provided a semiconductor device including a first fin-type pattern extending in a first direction on a substrate, a gate structure which intersects the first fin-type pattern, a first epitaxial layer on the first fin-type pattern on at least one side of the gate structure, and a metal contact which includes a first portion that contacts side walls of the gate structure, and a second portion that is spaced apart from the side walls of the gate structure on top of the first portion, wherein the first portion contacts the first epitaxial layer, and a width of the first portion is greater than a width of the second portion at an interface between the first portion and the second portion.

In some embodiments, the gate structure may comprise a gate insulating film, a gate electrode on the gate insulating film, and a spacer on at least one side of the gate electrode, wherein the first portion contacts the spacer.

In some embodiments, an interlayer insulating film may be provided which covers the gate structure and the first epitaxial layer, wherein the interlayer insulating film does not contact the first epitaxial layer.

In some embodiments, the interlayer insulating film may be disposed between the second portion and the gate structure.

In some embodiments, a barrier metal may be provided between the metal contact and the first epitaxial layer and between the metal contact and the interlayer insulating film.

In some embodiments, the barrier metal may comprise a first part which is in contact with the first epitaxial layer, and a second part which is in contact with the interlayer insulating film, and the first part and the second part have compositions different from each other.

In some embodiments, the metal contact may completely surround the outer circumferential surface of the first epitaxial layer.

In some embodiments, a field insulating film may be provided on the substrate, and the metal contact may contact the field insulating film.

In some embodiments, the first epitaxial layer may comprise Si and SiC, and the semiconductor device may operate as an NMOS transistor.

In some embodiments, a second epitaxial layer may be provided which covers a first area of the first epitaxial layer, wherein the metal contact covers an upper surface of the second epitaxial layer.

In some embodiments, the second epitaxial layer may comprise a material different from the first epitaxial layer.

In some embodiments, a field insulating film may be provided on the substrate, wherein a lower surface of the second epitaxial layer contacts the field insulating film, and an upper surface of the second epitaxial layer contacts the metal contact.

In some embodiments, an interlayer insulating film is provided which covers the gate structure and the first epitaxial layer, wherein the interlayer insulating film contacts an outer surface of a lower part of the first epitaxial layer, and the metal contact covers an outer surface of an upper part of the first epitaxial layer.

In some embodiments, a second epitaxial layer may be provided which completely covers an outer circumferential surface of the first epitaxial layer, wherein the second epitaxial layer comprises a material different from the first epitaxial layer.

In some embodiments, the first epitaxial layer may comprise SiGe, the second epitaxial layer may comprise Si or SiC, and the semiconductor device may operate as a PMOS transistor.

In some embodiments, a portion of the upper surface of the first fin-type pattern which overlaps the first epitaxial layer may be coplanar with a portion of the upper surface of the first fin-type pattern which overlaps the gate structure.

In some embodiments, the first portion and the second portion of the metal contact may comprise the same material and may be integrally formed.

According to still another aspect of the inventive concepts, there is provided a semiconductor device including a first fin-type pattern which protrudes upwardly from an upper surface of a field insulating film, a first epitaxial layer on the first fin-type pattern, an interlayer insulating film on the field insulating film that covers the first fin-type pattern and the first epitaxial layer, and a metal contact that extends along an outer circumferential surface of the first epitaxial layer within the interlayer insulating film, the metal contact contacting the field insulating film, an upper surface of the metal contact being coplanar with upper surface of the interlayer insulating film.

In some embodiments, a barrier metal may be provided between the metal contact and the first epitaxial layer and between the metal contact and the interlayer insulating film.

In some embodiments, the barrier metal may comprise a first area which is in contact with the first epitaxial layer, and a second area which is in contact with the interlayer insulating film, and the first area and the second area have compositions different from each other.

In some embodiments, a second epitaxial layer may be provided which completely covers the outer circumferential surface of the first epitaxial layer, wherein the second epitaxial layer comprises a material different from the first epitaxial layer.

In some embodiments, the metal contact may completely cover the outer circumferential surface of the second epitaxial layer.

In some embodiments, an upper surface of the first fin-type pattern which overlaps the first epitaxial layer may be coplanar with an upper surface of the first fin-type pattern which overlaps the gate structure.

According to still another aspect of the inventive concepts, there is provided a semiconductor device including a first fin-type pattern and a second fin-type pattern which protrude upwardly from an upper surface of a field insulating film and extend in a first direction, a gate structure which intersects the first fin-type pattern and the second fin-type pattern, a first epitaxial layer on the first fin-type pattern on at least one side of the gate structure, a second epitaxial layer on the second fin-type pattern on at least one side of the gate structure, and a metal contact which covers outer circumferential surfaces of the first epitaxial layer and the second epitaxial layer, wherein the metal contact comprises a first portion which contacts side walls of the gate structure, and a second portion which is spaced apart from the side walls of the gate structure on top of the first portion.

In some embodiments, the first epitaxial layer and the second epitaxial layer may be spaced apart from each other.

In some embodiments, a width of the first portion of the metal contact may be greater than a width of the second portion of the metal contact at an interface between the first and second portions of the metal contact.

According to another aspect of the inventive concepts, there is provided a method for manufacturing a semiconductor device, the method including forming a first fin-type pattern that extends in a first direction on a substrate, forming a gate structure that intersects the first fin-type pattern on the substrate, growing a first epitaxial layer on the first fin-type pattern on at least one side of the gate structure, growing a dummy epitaxial layer on the first epitaxial layer to cover an outer surface of the first epitaxial layer, forming an interlayer insulating film which covers the dummy epitaxial layer, forming a trench which passes through the interlayer insulating film so that at least a portion of the dummy epitaxial layer is exposed, etching the dummy epitaxial layer using an etching material having an etching selectivity with respect to the first epitaxial layer, and forming a metal contact by gap-filling a space between the interlayer insulating film and the first epitaxial layer with a metal material.

In some embodiments, the metal contact may completely cover an outer circumferential surface of the first epitaxial layer.

In some embodiments, when etching the dummy epitaxial layer, a remaining part of the dummy epitaxial layer is left on the substrate to surround a lower part of the first epitaxial layer, and the metal contact is formed to surround an upper surface of the remaining part of the dummy epitaxial layer and the top of the first epitaxial layer.

In some embodiments, the metal contact may include a first portion which is in contact with a side surface of the gate structure, and a second portion which is spaced apart from the side surface of the gate structure, and the interlayer insulation film may be between the second portion and the gate structure.

In some embodiments, a barrier metal may be formed on the interlayer insulating film and the first epitaxial layer after etching the dummy epitaxial layer and before forming the metal contact.

In some embodiments, a second epitaxial layer may be formed to cover the first epitaxial layer on the first epitaxial layer before the dummy epitaxial layer is formed.

According to another aspect of the inventive concepts, there is provided a method of manufacturing a semiconductor device, the method including forming a first fin-type pattern that extends in a first direction in a first area on a substrate; forming a first gate structure that intersects the first fin-type pattern on the substrate, forming a second fin-type pattern that extends in a second direction in a second area on the substrate; forming a second gate structure that intersects the second fin-type pattern on the substrate, growing a first epitaxial layer on the first fin-type pattern on at least one side of the first gate structure, growing a second epitaxial layer that is different from the first epitaxial layer on the second fin-type pattern of at least one side of the second gate structure, growing a dummy epitaxial layer to cover an outer surface of the first epitaxial layer, forming an interlayer insulating film which covers the first area and the second area, forming a first trench to expose at least a part of the dummy epitaxial layer, and a second trench to expose a part of the second epitaxial layer, forming a first photoresist film which covers the second area, etching the dummy epitaxial layer using an etching material having an etching selectivity with respect to the first epitaxial layer, removing the first photoresist film, and forming a first metal contact in the first trench and a second metal contact in the second trench.

In some embodiments, a lowermost surface of the second metal contact may be lower than an uppermost surface of the second epitaxial layer.

In some embodiments, the first metal contact may completely surround an outer circumferential surface of the first epitaxial layer, and the second metal contact may contact only a part of the upper surface of the second epitaxial layer.

In some embodiments, a first barrier metal may be formed to completely cover the outer circumferential surface of the first epitaxial layer, and a second barrier metal may be formed on only a part of the second epitaxial layer.

In some embodiments, a second photoresist layer may be formed to cover the first area after removing the first photoresist film, and a silicide layer may be formed at the top of the second epitaxial layer.

According to another aspect of the inventive concepts, a semiconductor device is provided that includes a semiconductor substrate; a field insulating layer on the semiconductor substrate; a first fin-type structure that extends in a first direction along a top surface of a semiconductor substrate, the first fin-type structure extending upwardly through the field insulating layer; a first gate structure that extends in a second direction along a top surface of the semiconductor substrate to intersect the first fin-type structure; a first epitaxial layer extending upwardly from the first fin-type structure; and a metal contact covering at least a portion of side surfaces of the first epitaxial layer, wherein portions of the metal contact that cover the side surfaces of the first epitaxial layer have a substantially constant thickness.

In some embodiments, the metal contact may contact the field insulating layer and may contact the first epitaxial layer.

In some embodiments, a barrier metal may be provided between the first epitaxial layer and the metal contact, between the metal contact and the field insulating layer, and between the metal contact and an interlayer insulating film that covers sidewalls of the metal contact.

In some embodiments, a second epitaxial layer may be provided on lower portions of the side surfaces of the first epitaxial layer, where the second epitaxial layer has a thickness that is substantially the same as the substantially constant thickness of the portions of the metal contact that cover the side surfaces of the first epitaxial layer In some embodiments, a second epitaxial layer may be provided that completely covers the side surfaces and a top surface of the first epitaxial layer, the metal contact completely covering side surfaces and a top surface of the second epitaxial layer, wherein both the second epitaxial layer and the metal contact may contact the field insulating layer.

However, aspects of the inventive concepts are not restricted to those set forth herein. The above and other aspects of the inventive concepts will become more apparent to one of ordinary skill in the art to which the inventive concepts pertain by referencing the detailed description of the present concepts given below.

BRIEF DESCRIPTION OF THE DRAWINGS

The above and other aspects and features of the inventive concepts will become more apparent by the following description of example embodiments thereof with reference to the attached drawings, in which.

DETAILED DESCRIPTION OF THE EMBODIMENTS

Figure 1:
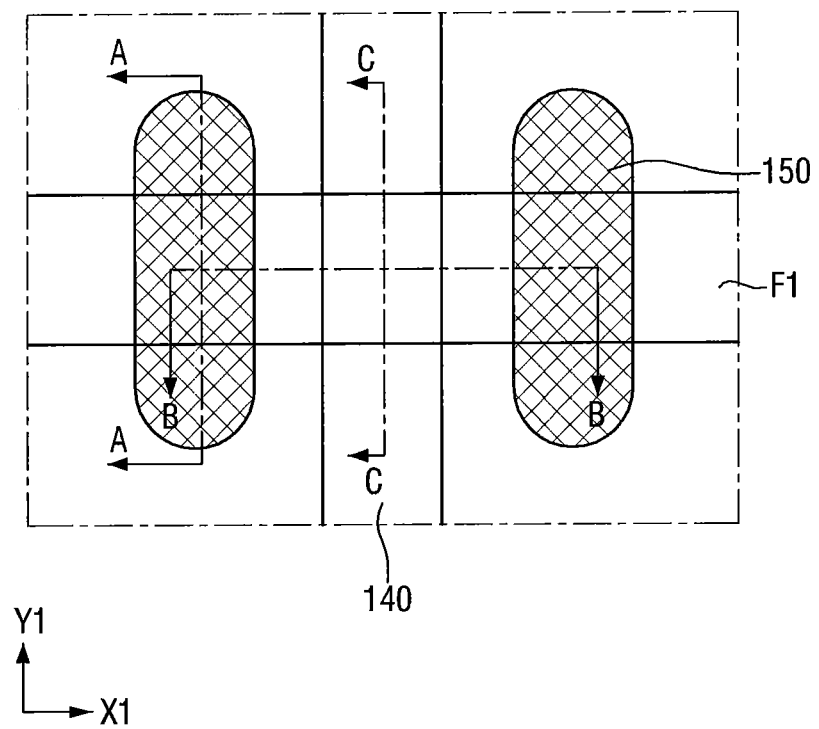
FIG. 1 is a layout diagram illustrating a semiconductor device according to an embodiment of the inventive concepts.

Advantages and features of the inventive concepts and methods of accomplishing the same may be understood more readily by reference to the following detailed description and the accompanying drawings. The inventive concepts may, however, be embodied in many different forms and should not be construed as being limited to the embodiments set forth herein. Rather, these embodiments are provided so that this disclosure will be thorough and complete and will fully convey the inventive concepts to those skilled in the art. In the drawings, the thickness of layers and regions may be exaggerated for clarity.

It will be understood that when an element or layer is referred to as being "on," "contacting" or "connected to" another element or layer, it can be directly on, directly contacting or directly connected to the other element or layer, or alternatively, intervening elements or layers may be present. In contrast, when an element is referred to as being "directly on," "directly contacting" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The inventive concepts will be described with reference to plan and cross-sectional views in which embodiments of the inventive concepts are shown. It will be appreciated, however, that the profile of an exemplary view may be modified according to manufacturing techniques and/or allowances. That is, the embodiments discussed herein are not intended to limit the scope of the inventive concepts but covers all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better explain the inventive concepts and is not a limitation on the scope of the inventive concepts unless otherwise specified.

Those skilled in the art will appreciate that many variations and modifications can be made to the embodiments discussed below without substantially departing from the principles of the inventive concepts.

Hereinafter, semiconductor devices according to some embodiments of the inventive concepts will be described with reference to FIGS. 1 to 25.

Figure 2:
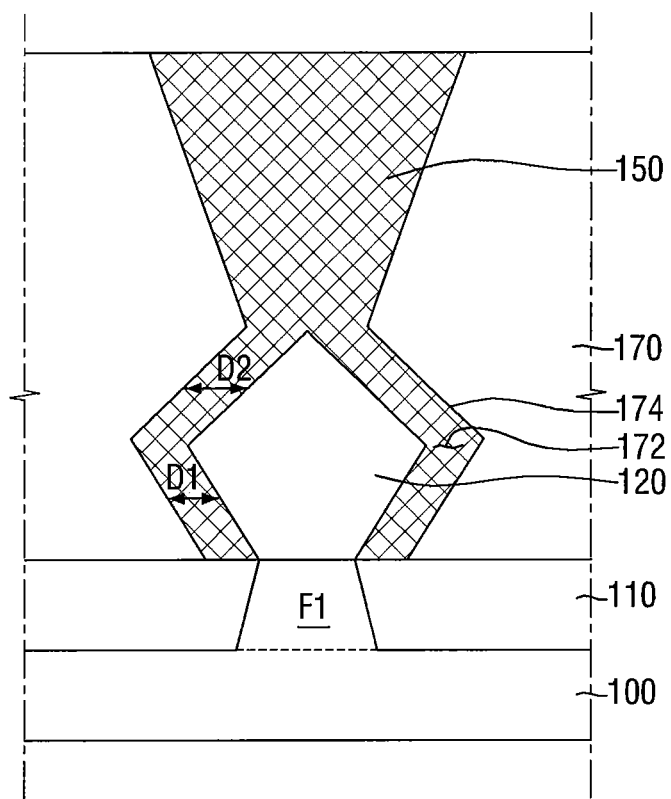
FIGS. 2, 3 and 4 are cross-sectional views taken along lines A-A, B-B and C-C, respectively, of the semiconductor device of FIG. 1.
Figure 3:
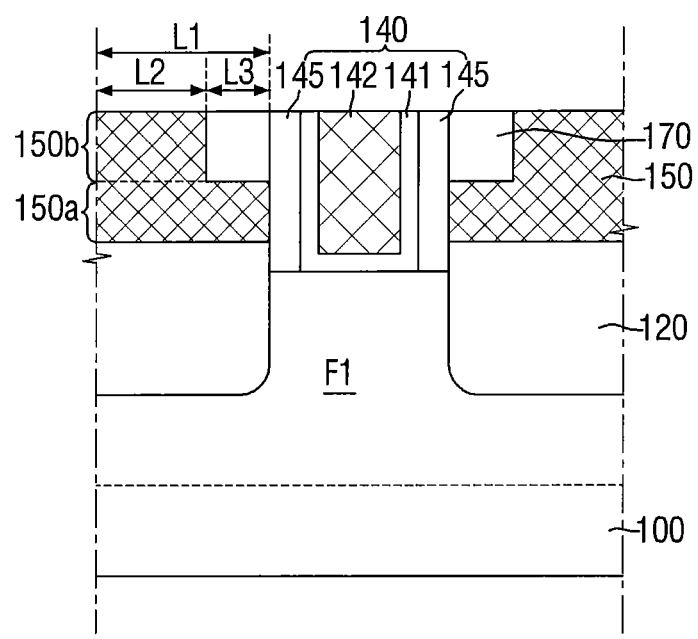
Figure 4:
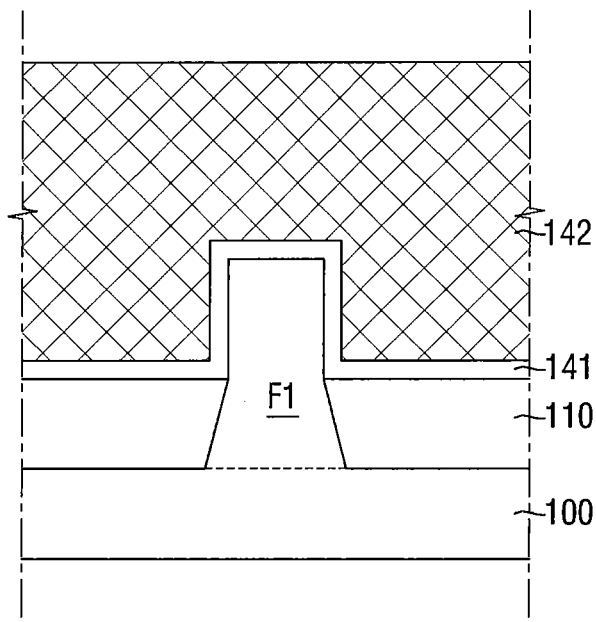

FIG. 1 is a layout diagram illustrating a semiconductor device according to an embodiment of the inventive concepts. FIGS. 2, 3 and 4 are cross-sectional views taken along lines A-A, B-B and C-C, respectively, of the semiconductor device of FIG. 1.

Referring to FIGS. 1 to 4, the semiconductor device 1a includes a substrate 100, a first fin-type pattern F1, a gate structure 140, a first epitaxial layer 120, a metal contact 150, an interlayer insulating film 170 and the like.

The substrate 100 may be, for example, a semiconductor substrate. The substrate 100 may include one of silicon, strained silicon (Si), silicon alloy, silicon carbide (SiC), silicon germanium (SiGe), silicon germanium carbide (SiGeC), germanium, germanium alloy, gallium arsenide (GaAs), indium arsenide (InAs) and a III-V semiconductor, a II-VI semiconductor, combinations thereof, and laminations thereof. Alternatively, the substrate may be an organic plastic substrate rather than the semiconductor substrate 100. Hereinafter, the substrate 100 will be described as being made of silicon.

The substrate 100 may be a P-type semiconductor substrate or an N-type semiconductor substrate. In other embodiments, an insulating substrate may be used as the substrate 100. Specifically, silicon on insulator (SOI) substrate may be used. When using an SOI substrate, there may be an advantage of being able to reduce a delay time in an operation process of the semiconductor device 1a.

The first fin-type pattern F1 may extend longer along a first direction X1 than along a third direction Y1. The first fin-type pattern F1 may be a part of the substrate 100 and may include an epitaxial layer that is grown from the substrate 100.

The field insulating film 110 is formed on the substrate 100 and is used for element isolation. The field insulating film 110 may be a shallow trench isolation (STI) structure which may be advantageous for high integration because it may exhibit excellent isolation characteristics within a small area. Other field insulating films may be used in other embodiments. The field insulating films 110 may include, for example, at least one of silicon oxide, silicon nitride, silicon oxynitride and combinations thereof. An upper portion of the first fin-type pattern F1 may protrude upwardly from an upper surface of the field insulating film 110.

The gate structure 140 may be formed on the first fin-type pattern F1 in a direction which intersects the first fin-type pattern F1. For example, the gate structure 140 may extend along the third direction Y1 which intersects the first direction X1.

The gate structure 140 may include a gate insulating film 141, a gate electrode 142, a spacer 145 and the like which are sequentially formed on the first fin-type pattern F1. By such a structure, channels may be formed on both side surfaces and the upper surface of the first fin-type pattern F1.

Although it is not clearly illustrated in the drawings, an interface film may be formed between the first fin-type pattern F1 and the gate insulating film 141. The interface film may serve to reduce or prevent a defective interface between the first fin-type pattern F1 and the gate insulating film 141. The interface film may include a low dielectric material layer having a dielectric constant (k) of 9 or less, for example, a silicon oxide film (k is approximately 4) or a silicon oxynitride film (k is approximately 4 to 8 depending on the respective oxygen and nitrogen contents). Further, the interface film may also be made of silicate, or may be made of a combination of the aforementioned films.

The gate insulating film 141 may be formed on the field insulating film 110 and the first fin-type pattern F1. The gate insulating film 141 may contain a material having a high dielectric constant (high-k). Specifically, the gate insulating film 141 may contain, for example, any one of the materials selected from a group which includes HfSiON, $HfO_2$, $ZrO_2$, $Ta_2O_5$, $TiO_2$, $SrTiO_3$, $BaTiO_3$ and $SrTiO_3$. The gate insulating film 141 may be formed to have a suitable thickness, depending on the types of element to be formed. According to some embodiments of the inventive concepts, as illustrated in FIG. 3, the gate insulating film 141 may extend upward along the side walls of a gate spacer 145 which will be described later.

The gate electrode 142 may contain a conductive material. In some embodiments of the inventive concepts, the gate electrode 142 may contain a metal having high conductivity, but the inventive concepts are not limited thereto. That is, in other embodiments of the inventive concepts, the gate electrode 142 may be made of a non-metal such as polysilicon. For example, the gate electrode 142 may be made of Si, SiGe or the like. The gate electrode 142 may be formed, for example, through the replacement process in some embodiments.

Although it is not clearly illustrated in the drawings, in some embodiments of the inventive concepts, the gate electrode 142 may include two or more laminated metal layers. The first metal layer may serve to adjust a work function, and the second metal layer may serve to fill a space formed by the first metal layer. For example, the first metal layer may contain at least one of TiN, TaN, TiC and TaC. Further, the second metal layer may contain W or Al. The gate structure 140 of the inventive concepts may be formed by a gate last manufacturing process.

The spacer 145 may be on at least one side of the gate electrode 142. As illustrated in FIG. 3, the spacer 145 may be on both sides of the gate electrode 142. The spacer 145 may include at least one of a nitride film and an oxynitride film. In FIG. 3, one side surface of the spacer 145 is illustrated as a straight line, but the inventive concepts are not limited thereto. For example, in other embodiments of the inventive concepts, the spacer 145 may have a curved shape, an L shape or the like.

The first epitaxial layer 120 may be formed on the first fin-type pattern F1 on at least one side of the gate structure 140. The first epitaxial layer 120 may be formed on both sides of the gate structure 140. The first epitaxial layer 120 may be in contact with the side surface of the spacer. The first epitaxial layer 120 may be a source/drain of the semiconductor device 1a.

The first epitaxial layer 120 may have various shapes. For example, the first epitaxial layer 120 may have a diamond shape or a rectangular shape in some embodiments. However, the inventive concepts are not limited thereto.

The first epitaxial layer 120 may be formed by an epitaxial growth method. In some embodiments, the first epitaxial layer 120 may contain silicon or germanium. In other embodiments, the first epitaxial layer 120 may include a compound semiconductor, and for example, may contain a group IV-IV compound semiconductor or a group III-V compound semiconductor. Specifically, taking the group IV-IV compound semiconductor as an example, the epitaxial layer 120 may be a binary compound or a ternary compound containing at least two or more of carbon (C), silicon (Si), germanium (Ge) and tin (Sn), or a compound in which these elements are doped with a Group IV element. Taking the group III-V compound semiconductor as an example, the epitaxial layer may be a binary compound, a ternary compound or a quaternary compound which is formed of at least one of aluminum (Al), gallium (Ga) and indium (In) as a group III element with at least one of phosphorus (P), arsenic (As) and antimony (Sb) as a group V element. Although it is not illustrated in the drawings, the first epitaxial layer 120 may have an LDD structure. However, the inventive concepts are not limited thereto.

When the semiconductor device 1a according to an embodiment of the inventive concept is a PMOS transistor, the first epitaxial layer 120 may contain a compressive stress material. For example, the compressive stress material may be a material having a lattice constant larger than Si, for example, SiGe. The compressive stress material may improve the mobility of the carriers of the channel area, by adding a compressive stress to the first fin-type pattern F1.

In contrast, when the semiconductor device 1a is an NMOS transistor, the first epitaxial layer 120 may be the same material as the substrate 100 or may be a tensile stress material. For example, when the substrate 100 is Si, the first epitaxial layer 120 may be Si or a material (e.g., SiC) having a lattice constant that is smaller than Si.

The interlayer insulating film 170 may be formed on the semiconductor substrate 100. The interlayer insulating film 170 may cover the gate structure 140 and the first epitaxial layer 120. However, the interlayer insulating film 170 may be formed so as not to be in direct contact with the first epitaxial layer 120.

The interlayer insulating film 170 may electrically insulate the semiconductor elements located below the interlayer insulating film 170 from the semiconductor element(s) located above the interlayer insulating film 170. The interlayer insulating film 170 may be formed of a silicon oxide, such as borosilicate glass (BSG), phosphosilicate glass (PSG), borophosphosilicate glass (BPSG), undoped silicate glass (USG), tetraethylorthosilicate glass (TEOS) or high density plasma-CVD (HDP-CVD).

The metal contact 150 may surround an outer circumferential surface of the first epitaxial layer 120. As used herein, the "outer circumferential surface" of an epitaxial layer that is formed above a fin-type pattern refers to the outer surface of the epitaxial layer with the exception of the bottom surface thereof that is above the fin-type pattern. For example, referring to FIG. 2, the metal contact 150 may completely surround the outer surface of the first epitaxial layer 120, except for the bottom of the first epitaxial layer 120 which contacts the first fin-type pattern F1. The metal contact 150 may be in contact with the upper surface of the field insulating film 110. The metal contact 150 may surround the first epitaxial layer 120 with a constant thickness. For example, a thickness D1 of the metal contact 150 which wraps around the bottom of the first epitaxial layer 120 may be substantially the same as a thickness D2 of the metal contact 150 which wraps around the top of the first epitaxial layer 120. However, the inventive concepts are not limited thereto.

As the metal contact 150 completely surrounds all but the bottom surface of the first epitaxial layer 120, the interlayer insulating film 170 may be spaced apart from the first epitaxial layer 120. The metal contact 150 may be formed within a first trench 174 which penetrates the interlayer insulating film 170.

The first trenches 174 may have a tapered shape. That is, the first trench 174 may be formed in a trapezoidal or reverse trapezoidal shape. However, the inventive concepts are not limited thereto, and the first trench 174 may have a rectangular shape. The first trench 174 may expose the outer circumferential surface of the first epitaxial layer 120 and a part of the field insulating film 110. However, the inventive concepts are not limited thereto.

The metal contact 150 may electrically connect a wiring that is on a top surface of the interlayer insulating film 170 with the first epitaxial layer 120 or the first fin-type pattern F1. For example, Al, Cu, W or the like may be used as the metal contact 150, but embodiments of the inventive concepts are not limited thereto. As illustrated in FIG. 2, the upper surface of the interlayer insulating film 170 may be on the same plane as the upper surface of the metal contact 150. The upper surfaces of the interlayer insulating film 170 and the metal contact 150 may be aligned through the planarization process (e.g., CMP process).

Referring to FIG. 3, the metal contact 150 may include a first portion 150*a* and a second portion 150*b*. The second portion 150*b* may be formed on the first portion 150*a*, and the second portion 150*b* and the first portion 150*a* may be integrally formed. The first portion 150*a* may be in contact with the upper surface of the first epitaxial layer 120, and may be in contact with the side walls of the gate structure 140. The second portion 150*b* may be on top of the first portion 150*a* and may be spaced apart from the side walls of the gate structure 140 (e.g., by a length L3). The interlayer insulating film 170 may be disposed between the second portion 150*b* and the gate structure 140. A part of the second portion 150*b* may be located below the upper surface of the gate structure 140.

At an interface between the first portion 150*a* and the second portion 150*b*, a width L1 of the first portion 150*a* may be greater than a width L2 of the second portion 150*b*. The first portion 150*a* and the second portion 150*b* may include the same material. However, the inventive concepts are not limited thereto.

As described with reference to FIGS. 1 to 4, the semiconductor device 1*a* includes the metal contact 150 which completely surrounds the outer surface of the first epitaxial layer 120 that extends above the field insulating film 110. This may reduce the contact resistance between the metal contact 150 and the first epitaxial layer 120.

The first epitaxial layer 120 may be surrounded by the metal contact 150, while remaining in an original form that is grown on the first fin-type pattern F1. To maintain the original form of the first epitaxial layer 120, a dummy epitaxial layer may be formed on the first epitaxial layer 120, and subsequently, the interlayer insulating film 170 which covers the dummy epitaxial layer is formed. Subsequently, after forming the first trench 174 which exposes the dummy epitaxial layer, the dummy epitaxial layer is removed, and thereafter, a process of gap-filling the metal contact 150 within an area in which the dummy epitaxial layer is formed may be used. The detailed description thereof will be provided below.

The semiconductor manufacturing process of the inventive concepts may not use a separate silicide forming process. Thus, by forming the metal contact 150 to surround first epitaxial layer 120 while remaining the original form, it is possible to reduce the contact resistance of the semiconductor device 1*a* and to further reduce the size of the contact. Thus, the semiconductor device 1*a* may exhibit improved performance.

Figure 5:
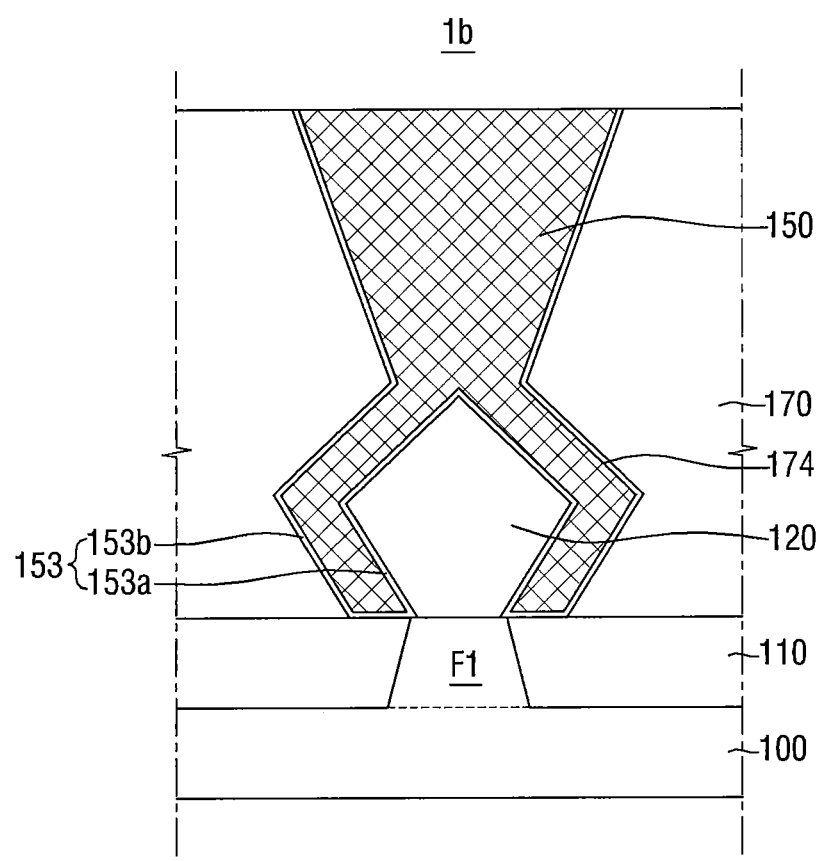
FIG. 5 is a cross-sectional view illustrating a semiconductor device according to another embodiment of the inventive concepts.

FIG. 5 is a cross-sectional view illustrating a semiconductor device according to another embodiment of the inventive concepts. For convenience of description, hereinafter, repeated description of the same matters as in the aforementioned embodiment will be omitted, and the differences will mainly be described.

Referring to FIG. 5, a semiconductor device 1*b* according to another embodiment of the inventive concepts may be operated substantially in the same manner as the semiconductor device 1*a* described above with reference to FIGS. 1 to 4.

However, the semiconductor device 1*b* may further include a barrier metal 153.

The barrier metal 153 may be formed on the inner surface of the first trench 174. The barrier metal 153 may include a first part 153*a* that is formed between the metal contact 150 and the first epitaxial layer 120, and a second part 153*b* that is formed between the metal contact 150 and the interlayer insulating film 170. That is, the first part 153*a* may be formed on the first epitaxial layer 120 so as to contact the first epitaxial layer 120, and the second part 153*b* may be formed so as contact the interlayer insulating film 170.

Thus, the barrier metal 153 may be formed along both side surfaces of the first trench 174 and the outer circumferential surface of the first epitaxial layer 120. The barrier metal 153 may be conformally formed along the inner surface of the first trench 174 with a constant thickness. The barrier metal 153 may contain titanium (Ti), titanium nitride (TiN) or tungsten nitride (WN). The barrier metal 153 may be formed using PVD, CVD or ILD methods.

The first part 153*a* and the second part 153*b* of the barrier metal 153 may be different from each other. For example, the first part 153*a* may contain a silicide material. The silicide material may be naturally generated at the interface between the first epitaxial layer 120 and the metal contact 150 during the manufacturing process in which the metal contact 150 is gap-filled in an area between the first epitaxial layer 120 and the interlayer insulating film 170. However, the inventive concepts are not limited thereto.

As the barrier metal 153 is included in the semiconductor device 1*b*, the contact resistance between the metal contact 150 and the first epitaxial layer 120 may be reduced, and the performance of the semiconductor device may be improved.

Figure 6:
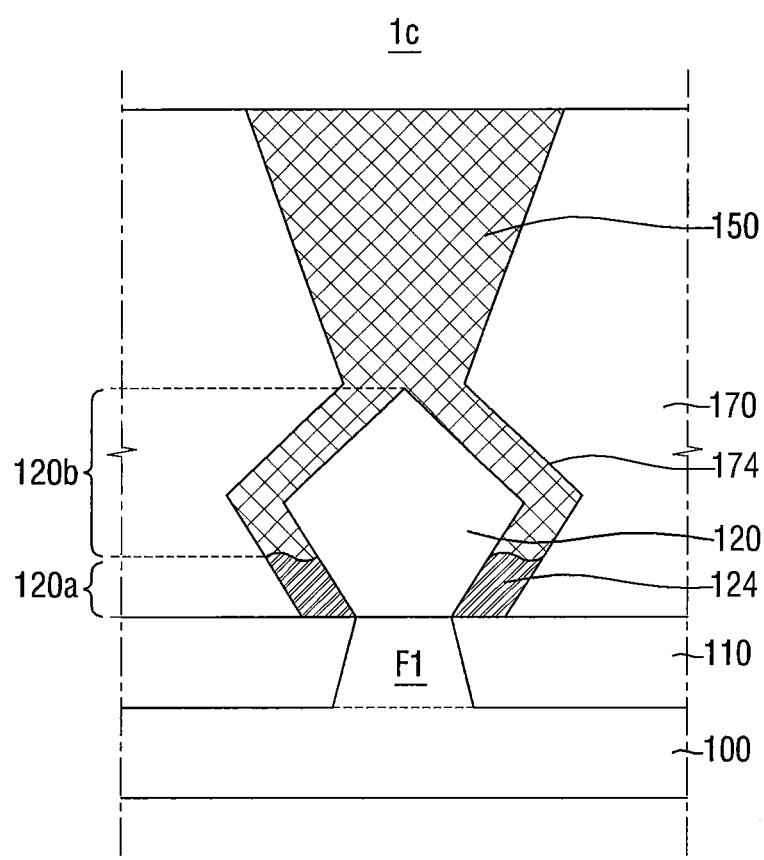
FIG. 6 is a cross-sectional view illustrating a semiconductor device according to still another embodiment of the inventive concepts.

FIG. 6 is a cross-sectional view illustrating a semiconductor device 1*c* according to still another embodiment of the inventive concepts. For convenience of description, hereinafter, repeated description of the same matters as in the aforementioned embodiment will be omitted, and the differences will mainly be described.

Referring to FIG. 6, the semiconductor device 1*c* may operate in substantially the same manner as the semiconductor device 1*a* that is described above with reference to FIGS. 1 to 4.

However, the semiconductor device 1*c* may further include a second epitaxial layer 124 which surrounds a first area 120*a* of the first epitaxial layer 120.

Specifically, the first epitaxial layer 120 may include a first area 120*a* and a second area 120*b*. The second area 120*b* is located over the first area 120*a*. The first area 120*a* may correspond to the bottom of the first epitaxial layer 120, and the second area 120*b* may correspond to the top of the first epitaxial layer 120.

The second epitaxial layer 124 surrounds the outer surface of the first area 120*a* and may be formed on the field insulating film 110. The second epitaxial layer 124 may be formed between the field insulating film 110 and the first area 120*a*. The second epitaxial layer 124 may be part of a dummy epitaxial layer that is formed during the manufacturing process. In particular, the second epitaxial layer 124 may be a part of the dummy epitaxial layer that remains after other portions of the dummy epitaxial layer are removed via an etching process. The second epitaxial layer 124 may be located below the first trench 174. However, the inventive concepts are not limited thereto.

The metal contact 150 may cover the upper surface of the second epitaxial layer 124 and may surround the outer surface of the second area 120b of first epitaxial layer 120. The metal contact 150 may be formed on the second epitaxial layer 124 within the first trench 174.

The second epitaxial layer 124 may contain a material different from the first epitaxial layer 120. For example, when the semiconductor device 1c is an NMOS device, the first epitaxial layer 120 may contain Si and SiC, and the second epitaxial layer 124 may contain SiGe. However, the inventive concepts are not limited thereto.

Although the metal contact 150 wraps around only a part of the first epitaxial layer 120, the semiconductor device 1c may operate in substantially the same manner as the semiconductor device 1a that is described above.

Figure 7:
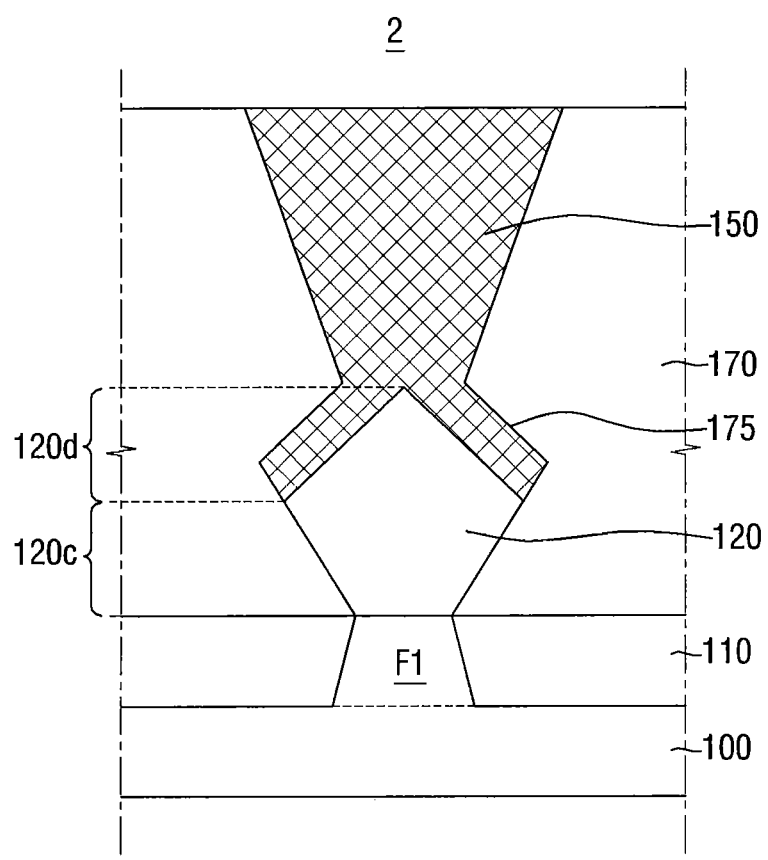
FIG. 7 is a cross-sectional view illustrating a semiconductor device according to still another embodiment of the inventive concepts.

FIG. 7 is a cross-sectional view illustrating a semiconductor device 2 according to still another embodiment of the inventive concepts. For convenience of description, hereinafter, repeated description of the same matters as in the aforementioned embodiments will be omitted, and the differences will mainly be described.

Referring to FIG. 7, the semiconductor device 2 may operate in substantially the same manner as the semiconductor device 1a described above with reference to FIGS. 1 to 4.

However, the metal contact 150 of the semiconductor device 2 may surround only an outer surface of an upper portion 120d of the first epitaxial layer 120, and the interlayer insulating film 170 may surround an outer surface of a lower portion 120c of the first epitaxial layer 120.

In the case of the semiconductor device 2, as the dummy epitaxial layer is etched after being formed only on the upper portion 120d of the first epitaxial layer 120, it may have a shape as shown in FIG. 7.

The first trench 175 exposes only the upper portion 120d of the first epitaxial layer 120, and as the metal contact 150 is formed within the first trench 175, the metal contact 150 may contact only the upper portion 120d of the first epitaxial layer 120. The interlayer insulating film 170 contacts the lower portion 120c of the first epitaxial layer 120.

The semiconductor device 2 may operate in substantially the same manner as the semiconductor device 1a that is described above.

Figure 8:
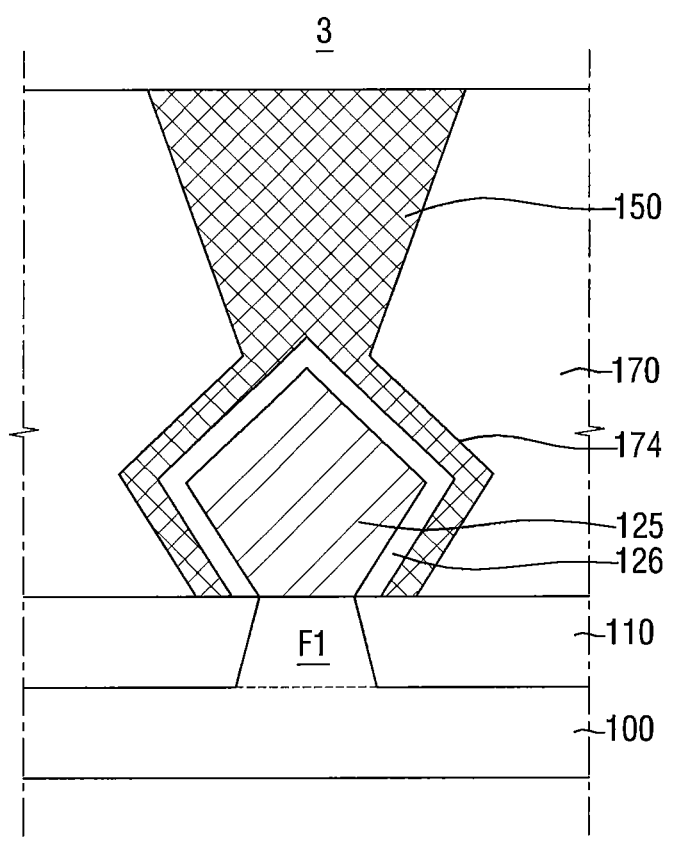
FIG. 8 is a cross-sectional view illustrating a semiconductor device according to still another embodiment of the inventive concepts.

FIG. 8 is a cross-sectional view illustrating a semiconductor device 3 according to still another embodiment of the inventive concepts. For convenience of description, hereinafter, repeated description of the same matters as in the aforementioned embodiment will be omitted, and the differences will mainly be described.

Referring to FIG. 8, the semiconductor device 3 may operate in substantially the same manner as the semiconductor device 1a that is described above with reference to FIGS. 1 to 4.

However, the semiconductor device 3 may further include a second epitaxial layer 126 which completely surrounds the outer circumferential surface of a first epitaxial layer 125. The second epitaxial layer 126 may be different from the first epitaxial layer 125.

The second epitaxial layer 126 may surround the outer circumferential surface of the first epitaxial layer 125. The second epitaxial layer 126 may completely surround an outer surface of the first epitaxial layer 125, except for a bottom portion of the first epitaxial layer 125 that contacts the first fin-type pattern F1. A part of the second epitaxial layer 126 may be in direct contact with the upper surface of the field insulating film 110. The second epitaxial layer 126 may surround the first epitaxial layer 125 with a constant thickness. For example, the thickness of the second epitaxial layer 126 which surrounds the lower portion of the first epitaxial layer 125 may be substantially the same as the thickness of the second epitaxial layer 126 which surrounds the upper portion of the first epitaxial layer 125. However, the inventive concepts are not limited thereto. Epitaxial layer 125 may be identical to epitaxial layer 120 that is discussed above with reference to FIGS. 1-4.

The metal contact 150 may be formed to surround the outer circumferential surface of the second epitaxial layer 126. The metal contact 150 may completely surround the outer surface of the second epitaxial layer 126 which faces the inner surface being in contact with the first epitaxial layer 125 with respect to the second epitaxial layer 126. A portion of the metal contact 150 may directly contact the upper surface of the field insulating film 110. The metal contact 150 may surround the second epitaxial layer 126 with a constant thickness. For example, the thickness of the metal contact 150 which wraps around the lower portion of the second epitaxial layer 126 may be substantially the same as the thickness of the metal contact 150 which wraps around the upper portion of the second epitaxial layer 126. However, the inventive concepts are not limited thereto.

The semiconductor device 3 may be operated as a PMOS transistor. The first epitaxial layer 125 may, for example, contain SiGe, and the second epitaxial layer 126 may, for example, contain Si or SiC. However, the inventive concepts are not limited thereto.

Similarly to the aforementioned semiconductor device 1a, the semiconductor device 3 may reduce the contact resistance and may further reduce the size of the contact. Thus, the performance of the semiconductor device may be improved.

Figure 9:
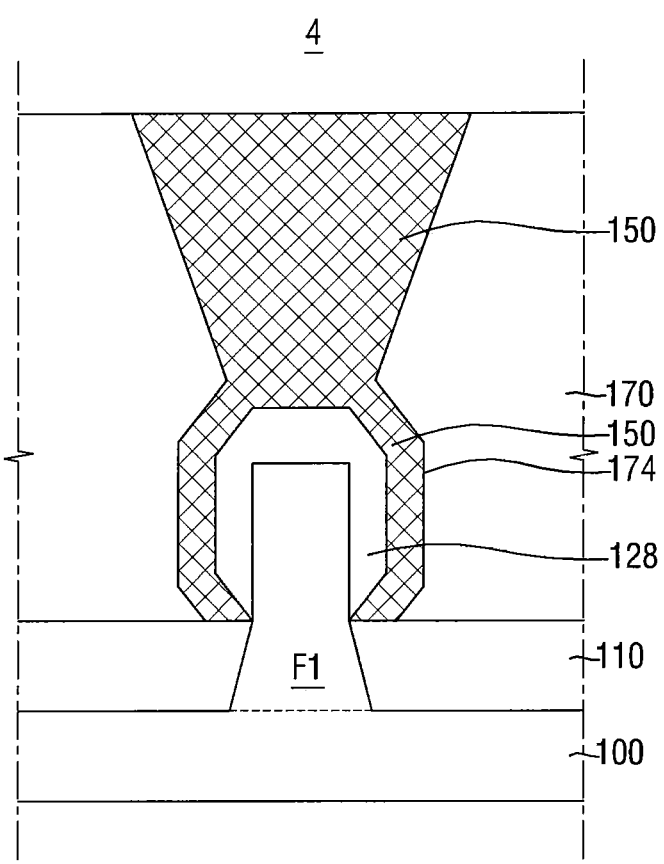
FIG. 9 is a cross-sectional view illustrating a semiconductor device according to still another embodiment of the inventive concepts.

FIG. 9 is a cross-sectional view illustrating a semiconductor device 4 according to still another embodiment of the inventive concepts. For convenience of description, hereinafter, repeated description of the same matters as in the aforementioned embodiment will be omitted, and the differences will mainly be described.

Referring to FIG. 9, the semiconductor device 4 may operate in substantially the same manner as the semiconductor device 1a that is described above with reference to FIGS. 1 to 4.

However, in the case of the semiconductor device 4, the first epitaxial layer 128 may surround the side walls and the upper surface of the first fin-type pattern F1. The upper surface of the first fin-type pattern F1 which overlaps the first epitaxial layer 128 may be disposed on the same plane as the upper surface of the first fin-type pattern F1 which overlaps the gate structure 140. Thus, the first epitaxial layer 128 may be formed along the periphery of the first fin-type pattern F1.

As described above, the metal contact 150 may surround the outer circumferential surface of the first epitaxial layer 128. The metal contact 150 may surround the first epitaxial layer 128 with a constant thickness, and a part of the metal contact 150 may be in contact with the upper surface of the field insulating film 110.

Figure 10:
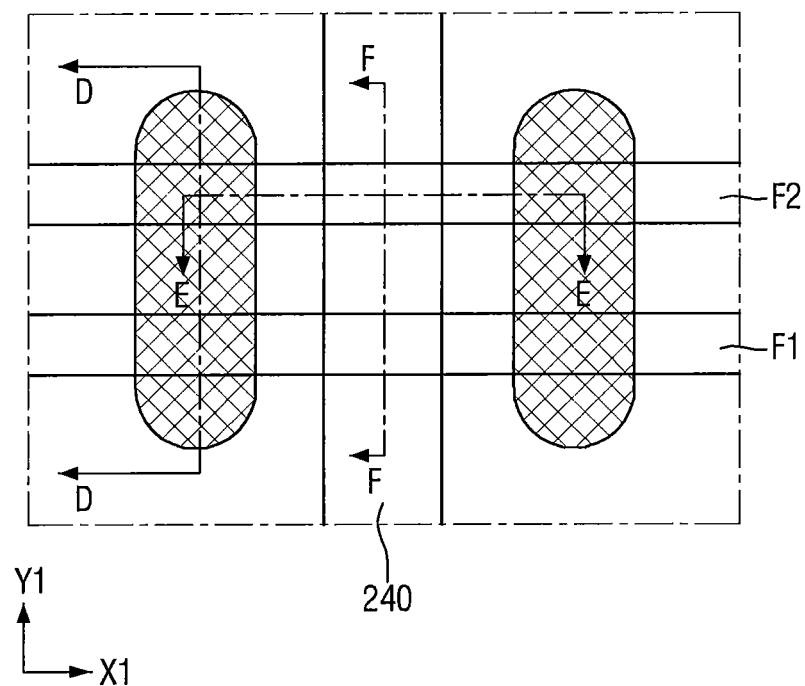
FIG. 10 is a layout diagram illustrating a semiconductor device according to still another embodiment of the inventive concepts.
Figure 11:
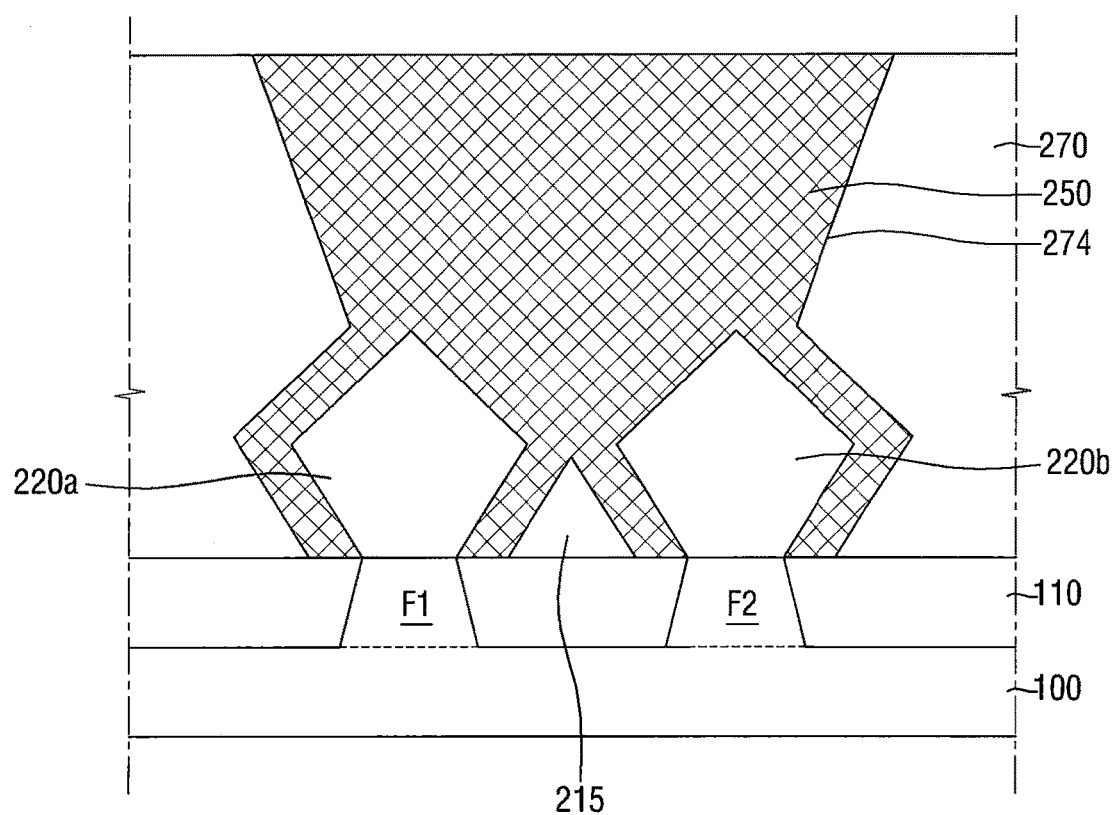
FIGS. 11, 12 and 13 are cross-sectionals view taken along lines D-D, E-E and F-F, respectively, of the semiconductor device of FIG. 10.
Figure 12:
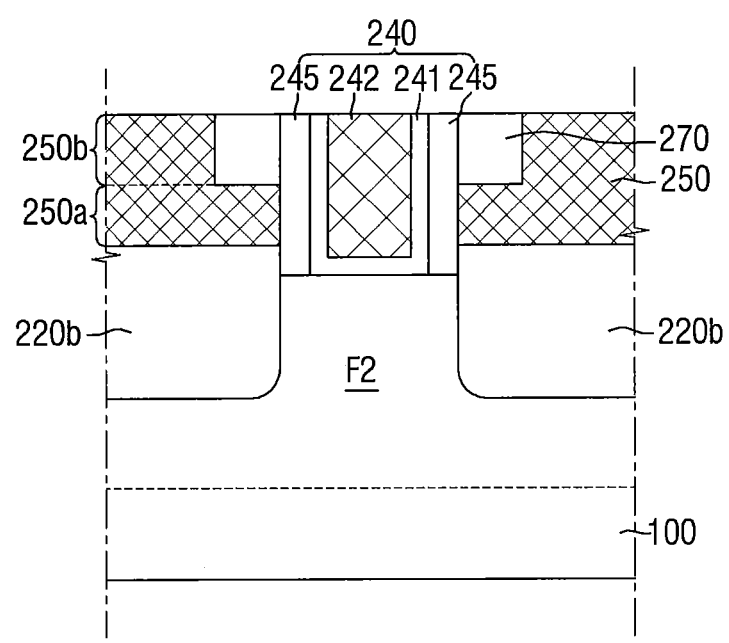
Figure 13:
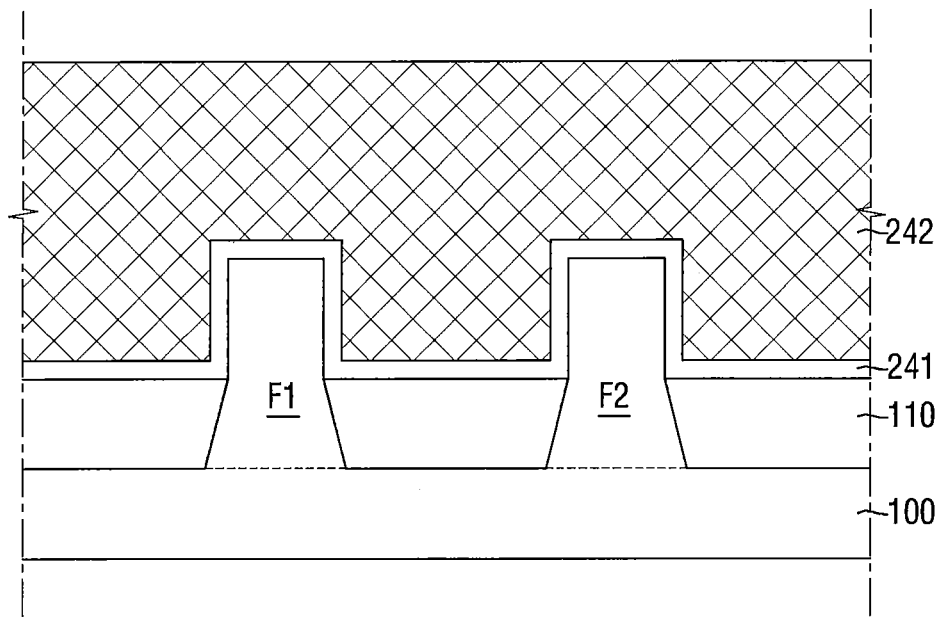

FIG. 10 is a layout diagram illustrating a semiconductor device 11 according to still another embodiment of the inventive concepts. FIGS. 11, 12 and 13 are cross-sectional views taken along the lines D-D, E-E and F-F, respectively, of the semiconductor device of FIG. 10. FIG. 12 is substantially the same as FIG. 3, and FIG. 13 is substantially the same as FIG. 4. Thus, for convenience of description, hereinafter, repeated description of the same matters as in the aforementioned embodiment will be omitted, and the differences will mainly be described.

Referring to FIGS. 10 to 13, the semiconductor device 11 includes a substrate 100, a first fin-type pattern F1, a second fin-type pattern F2, a gate structure 240, a first epitaxial layer 220a, a second epitaxial layer 220b, a metal contact 250 and an interlayer insulating film 270.

The first fin-type pattern F1 may extend on the substrate 100 along a first direction X1. Similarly, the second fin-type pattern F2 may extend on the same substrate 100 along the first direction X1. The first fin-type pattern F1 and the second fin-type pattern F2 may be spaced apart from each other. The first fin-type pattern F1 and the second fin-type pattern F2 may be a part of the substrate 100, and may include an epitaxial layer which is grown from the substrate 100.

The gate structure 240 may be formed on the first fin-type pattern F1 and on the second fin-type pattern F2 in a direction that intersects the first fin-type pattern F1 and the second fin-type pattern F2. For example, the gate structure 240 may extend along a third direction Y1 that intersects the first direction X1. The gate structure 240 may include a gate insulating film 241, a gate electrode 242, spacers 245 and the like which are sequentially formed on the first fin-type pattern F1 and the second fin-type pattern F2.

The first epitaxial layer 220a may be formed on the first fin-type pattern F1 on at least one side of the gate structure 240. The first epitaxial layer 220a may be formed on both sides of the gate structure 240. The first epitaxial layer 220a may contact the side surface of the spacer 245.

Similarly, the second epitaxial layer 220b may be formed on the second fin-type pattern F2 on at least one side of the gate structure 240. The second epitaxial layer 220b may be formed on both sides of the gate structure 240. The second epitaxial layer 220b may contact the side surface of the spacer 245. The first epitaxial layer 220a and the second epitaxial layer 220b may operate as the source/drains of the semiconductor device 11.

The first epitaxial layer 220a and the second epitaxial layer 220b may be spaced apart from each other, may contain the same material, and may have the same shape. However, the inventive concepts are not limited thereto.

The interlayer insulating film 270 may be formed on the semiconductor substrate 100. The interlayer insulating film 270 may cover the gate structure 240, the first epitaxial layer 220a and the second epitaxial layer 220b. However, the interlayer insulating film 270 may not be in direct contact with the first epitaxial layer 220a or the second epitaxial layer 220b.

The metal contact 250 may surround the outer circumferential surfaces of the first epitaxial layer 220a and the second epitaxial layer 220b. For example, referring to FIG. 11, the metal contact 250 may simultaneously and completely surround the outer surface of the first epitaxial layer 220a and the outer surface of the second epitaxial layer 220b except for the bottom surfaces that are on the respective first and second fin-type patterns F1 and F2. A part of the metal contact 250 may directly contact the upper surface of the field insulating film 110. Further, portions of the metal contact 250 that surround the first epitaxial layer 220a and the second epitaxial layer 220b may have the same thickness. However, the inventive concepts are not limited thereto.

As the metal contact 250 completely surrounds all but the respective bottom surfaces of the first epitaxial layer 220a and the second epitaxial layer 220b, the interlayer insulating film 270 may be spaced apart from the first epitaxial layer 220a and the second epitaxial layer 220b. The metal contact 250 may be formed within a first trench 274 which penetrates the interlayer insulating film 270.

Referring to FIG. 12, the metal contact 250 may include a first portion 250a and a second portion 250b. The second portion 250b may be formed on top of the first portion 250a, and the second portion 250b and the first portion 250a may be integrally formed. The first portion 250a may directly contact the upper surfaces of the first epitaxial layer 220a and the second epitaxial layer 220b, and may directly contact the side walls of the gate structure 240. The second portion 250b may be spaced apart from the side walls of the gate structure 240. The interlayer insulating film 270 may be between the second portion 250b and the gate structure 240.

At the interface between the first portion 250a and the second portion 250b, the width of the first portion 250a may be greater than the width of the second portion 250b. The first portion 250a and the second portion 250b may include the same material. However, the inventive concepts are not limited thereto.

In addition, referring to FIG. 11, a protruding area 215 may be formed between the metal contact 250 and the field insulating film 110.

Specifically, the protruding area 215 may be located between the first epitaxial layer 220a, the second epitaxial layer 220b and the field insulating film 110. The protruding area 215 may comprise the same material as the interlayer insulating film 270. However, the inventive concepts are not limited thereto.

The protruding area 215 may correspond to a depletion area that is formed below the dummy epitaxial layer in the process of manufacturing the semiconductor device 11. The protruding area 215 may completely overlap the field insulating film 110.

The semiconductor device 11 includes a metal contact 250 that may completely surround all but the bottom surfaces of the respective first and second epitaxial layers 220a, 220b. This configuration may reduce or minimize the contact resistance between the metal contact 250 and the respective first and second epitaxial layers 220a, 220b.

In addition, in the semiconductor device 11, the first epitaxial layer 220a and the second epitaxial layer 220b may be surrounded by the metal contact 250, while maintaining an epitaxially grown original form.

As the metal contact 250 surrounds the first epitaxial layer 220a and the second epitaxial layer 220b while maintaining the original form, the contact resistance of the semiconductor device 11 may be reduced, and the size of the contact may also be reduced. Thus, performance of the semiconductor device may be improved.

Figure 14A:
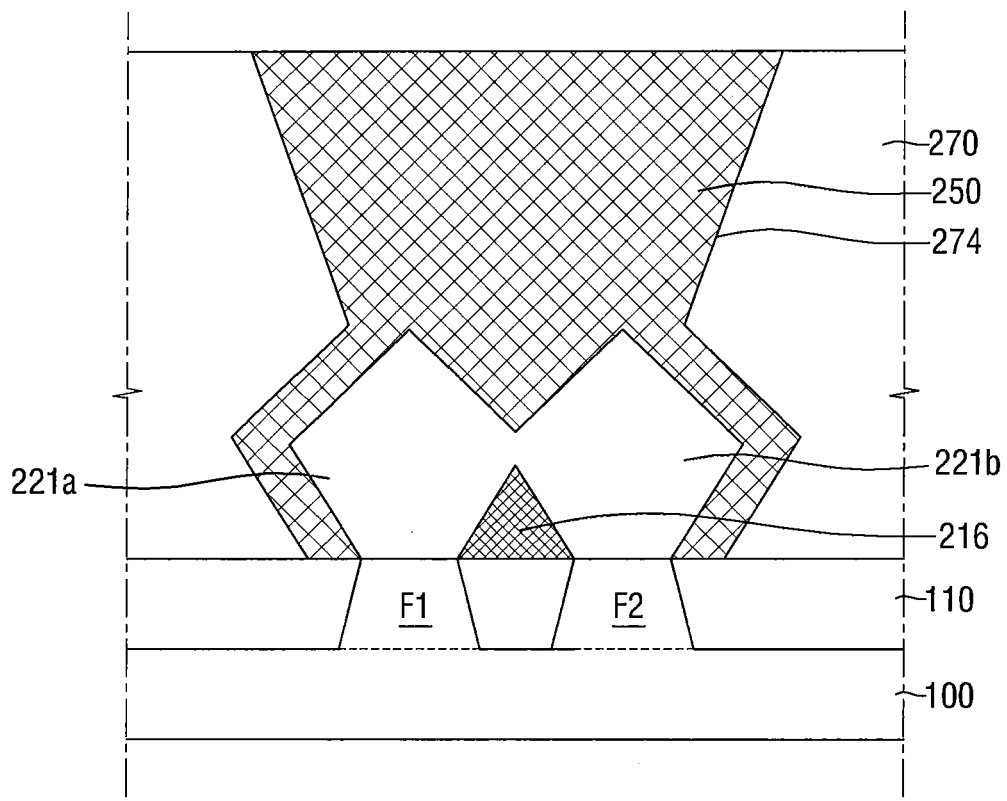
FIGS. 14A and 14B are cross-sectional views illustrating semiconductor devices according to further embodiments of the inventive concepts.
Figure 14B:
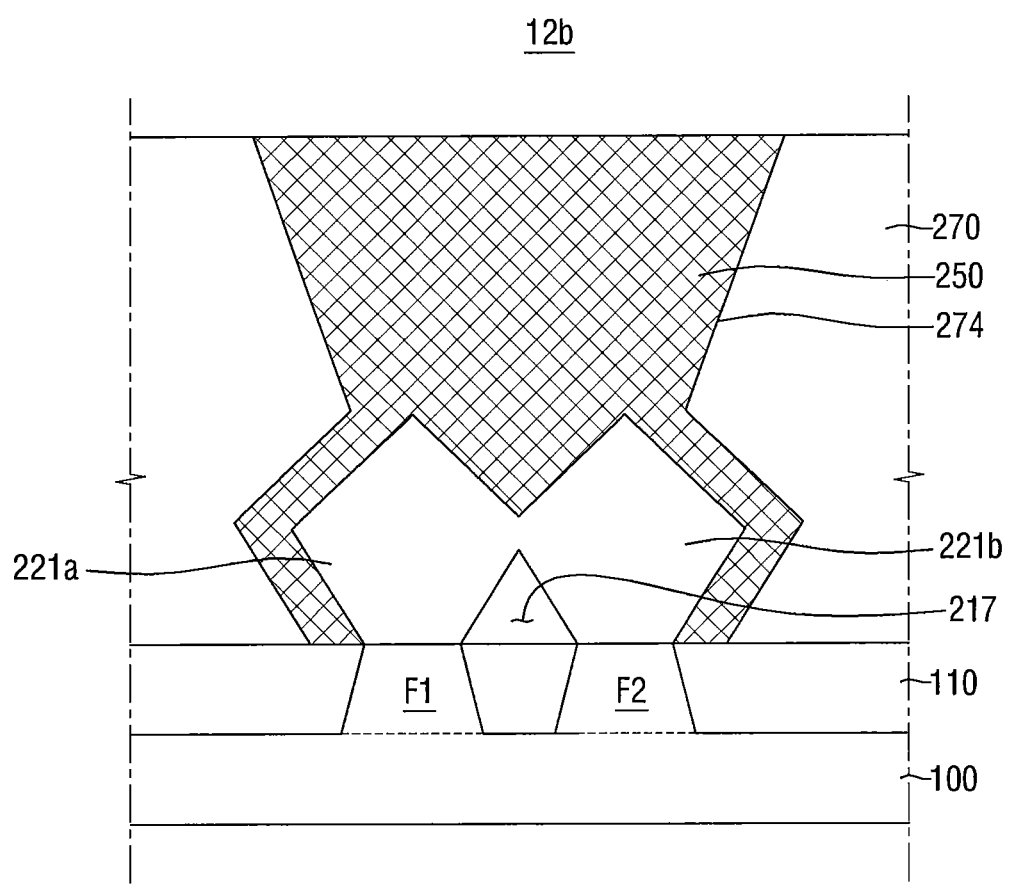

FIGS. 14A and 14B are cross-sectional views illustrating semiconductor devices 12a and 12b according to further embodiments of the inventive concepts. For convenience of description, hereinafter, repeated description of the same matters as in the aforementioned embodiment will be omitted, and the differences will mainly be described.

Referring to be 14A and FIG. 14B, the semiconductor devices 12a, 12b may operate in substantially the same manner as the semiconductor device 11 that is described above with reference to FIGS. 10 to 13.

However, the first epitaxial layer 221a and the second epitaxial layer 221b of the semiconductor devices 12a, 12b may be formed so as to be in contact with each other. The first epitaxial layer 221a and the second epitaxial layer 221b may be integrally formed, and they may include the same material. The metal contact 250 may surround the outer circumferential surfaces of the first epitaxial layer 221a and the second epitaxial layer 221b.

Further, referring to FIG. 14A, in the semiconductor device 12a, a protruding area 216 may be formed between the first epitaxial layer 221a, the second epitaxial layer 221b and the field insulating film 110. This protruding area 216 may be filled with the same material that is used to form the metal contact 250.

However, the inventive concepts are not limited thereto. For example, referring to FIG. 14B, in the semiconductor device 12b, the protruding area 217 may include an air gap. That is, a depletion layer may be formed in the protruding area 217.

Figure 15:
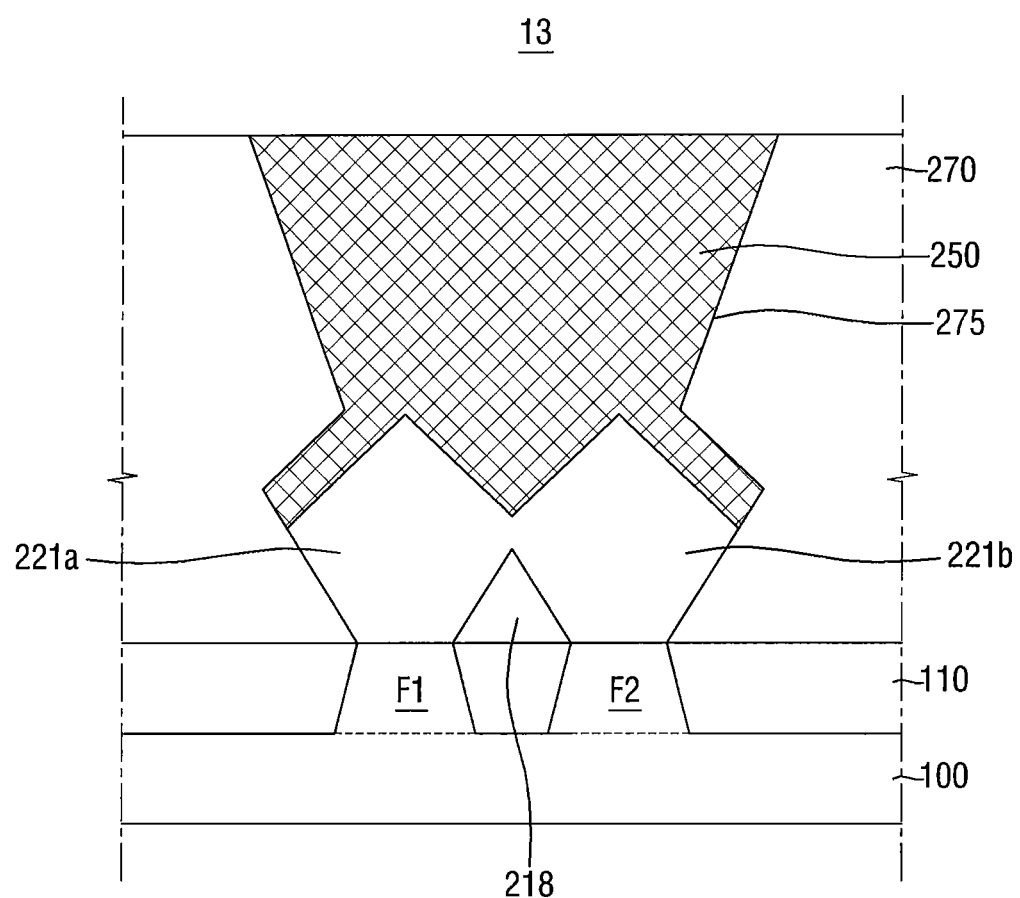
FIG. 15 is a cross-sectional view illustrating a semiconductor device according to still another embodiment of the inventive concepts.

FIG. 15 is a cross-sectional view illustrating a semiconductor device 13 according to still another embodiment of the inventive concepts. For convenience of description, hereinafter, repeated description of the same matters as in the aforementioned embodiment will be omitted, and the differences will mainly be described.

Referring to FIG. 15, the semiconductor device 13 may operate in substantially the same manner as the semiconductor device 11 that is described above with reference to FIGS. 10 to 13.

However, the metal contact 250 of the semiconductor device 13 may surround only the outer surfaces of the upper parts of the first epitaxial layer 221a and the second epitaxial layer 221b, and the interlayer insulating film 270 may surround the outer surfaces of the lower parts of the first epitaxial layer 221a and the second epitaxial layer 221b.

In the manufacturing process of the semiconductor device 13, a first trench 275 exposes only the upper parts of the first epitaxial layer 221a and the second epitaxial layer 221b. As the metal contact 250 is formed in the first trench 275, as illustrated in FIG. 15, the metal contact 250 only contacts the upper surfaces of the first epitaxial layer 221a and the second epitaxial layer 221b. The interlayer insulating film 270 contacts the side surfaces of the lower parts of the first epitaxial layer 221a and the second epitaxial layer 221b.

Although the metal contact 250 partially surrounds the first epitaxial layer 221a and the second epitaxial layer 221b, the semiconductor device 13 may operate in substantially the same manner as the semiconductor device 11 that is described above.

A protruding area 218 of the semiconductor device 13 may be filled with the interlayer insulating film 270, but the inventive concepts are not limited thereto.

Figure 16:
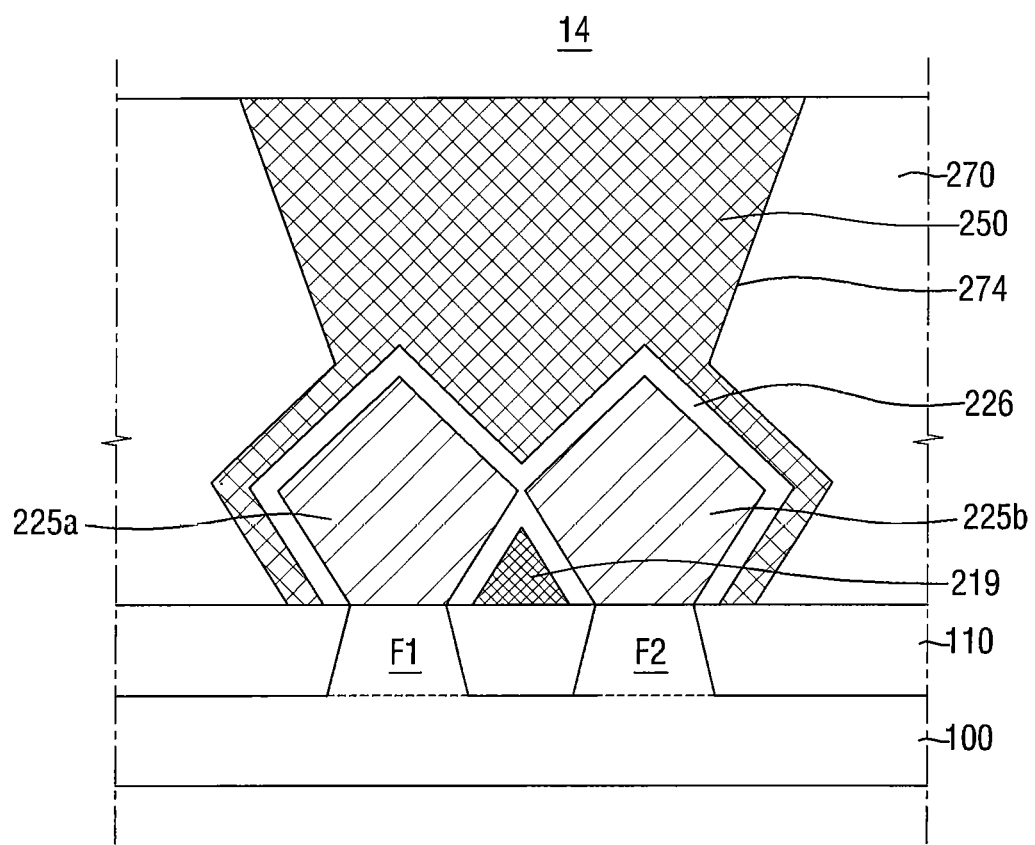
FIG. 16 is a cross-sectional view illustrating a semiconductor device according to still another embodiment of the inventive concepts.

FIG. 16 is a cross-sectional view illustrating a semiconductor device 14 according to still another embodiment of the inventive concepts. For convenience of description, hereinafter, repeated description of the same matters as in the aforementioned embodiment will be omitted, and the differences will mainly be described.

Referring to FIG. 16, the semiconductor device 14 may operate in substantially the same manner as the semiconductor device 11 that is described above with reference to FIGS. 10 to 13.

However, the semiconductor device 14 may further include a third epitaxial layer 226 that completely surrounds the outer circumferential surfaces of the first epitaxial layer 225a and the second epitaxial layer 225b. The third epitaxial layer 226 may comprise a material that is different from the material used to form the first epitaxial layer 225a and the second epitaxial layer 225b.

Specifically, the third epitaxial layer 226 may completely surround the outer circumferential surfaces of the first epitaxial layer 225a and the second epitaxial layer 225b (i.e., the outer surfaces that are exposed above an upper surface of the field insulating film 110). A part of the third epitaxial layer 226 may directly contact the upper surface of the field insulating film 110. Further, the third epitaxial layer 226 may surround the first epitaxial layer 225a and the second epitaxial layer 225b with a constant thickness.

The metal contact 250 may surround the outer circumferential surface of the third epitaxial layer 226. The metal contact 250 may completely surround the outer circumferential surface of the third epitaxial layer 226. A part of the metal contact 250 may be in contact with the upper surface of the field insulating film 110. In addition, the metal contact 250 may surround the third epitaxial layer 226 with a constant thickness. For example, the thickness of the metal contact 250 which wraps around the lower part of the third epitaxial layer 226 may be substantially the same as the thickness of the metal contact 250 which wraps around the upper part of the third epitaxial layer 226. However, the inventive concepts are not limited thereto.

The first epitaxial layer 225a and the second epitaxial layer 225b include the same material, and the third epitaxial layer 226 may include a material different from the first epitaxial layer 225a and the second epitaxial layer 225b.

For example, the semiconductor device 14 may be operated as a PMOS transistor. In this case, the first epitaxial layer 225a and the second epitaxial layer 225b may include SiGe, and the third epitaxial layer 226 may include Si or SiC. However, the inventive concepts are not limited thereto.

The semiconductor device 14 may reduce the contact resistance, like the aforementioned semiconductor device 11, and may further reduce the size of the contact. Thus, performance of the semiconductor device may be improved.

The protruding area 219 of the semiconductor device 14 may be filled with the metal contact 250 or the interlayer insulating film 270, but the inventive concepts are not limited thereto.

Figure 17:
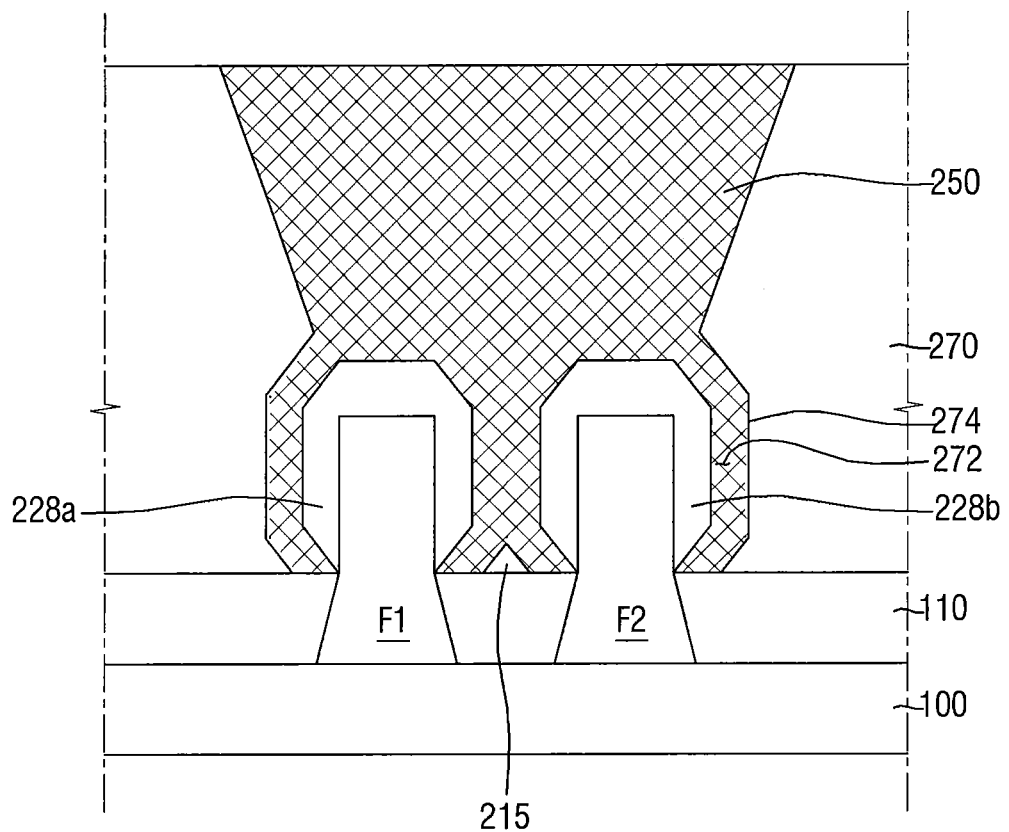
FIG. 17 is a cross-sectional view illustrating a semiconductor device according to still another embodiment of the inventive concepts.

FIG. 17 is a cross-sectional view illustrating a semiconductor device 15 according to still another embodiment of the inventive concepts. For convenience of description, hereinafter, repeated description of the same matters as in the aforementioned embodiment will be omitted, and the differences will mainly be described.

Referring to FIG. 17, the semiconductor device 15 may operate in substantially the same manner as the semiconductor device 11 described above with reference to FIGS. 10 to 13.

In the case of the semiconductor device 15, a first epitaxial layer 228a may be formed to surround the side walls and the upper surface of the first fin-type pattern F1. Similarly, a second epitaxial layer 228b may be formed to surround the side walls and the upper surface of the second fin-type pattern F2.

The upper surface of the first fin-type pattern F1 which overlaps the first epitaxial layer 228a may be coplanar with the upper surface of the first fin-type pattern F1 which overlaps the gate structure 240. Similarly, the upper surface of the second fin-type pattern F2 which overlaps the second epitaxial layer 228b may be coplanar with the upper surface of the second fin-type pattern F2 which overlaps the gate structure 240.

Thus, the first epitaxial layer 228a may formed along the periphery of the first fin-type pattern F1, and the second epitaxial layer 228b may be formed along the periphery of the second fin-type pattern F2. The metal contact 250 may be formed by gap-filling spaces 272 between the interlayer insulating film 270 and the first epitaxial layer 228a and between the interlayer insulating film 270 and the second epitaxial layer 228b using a metal material.

As described above, the metal contact 250 may surround the outer circumferential surfaces of the first epitaxial layer 228a and the second epitaxial layer 228b. The metal contact 250 may surround the first epitaxial layer 228a and the second epitaxial layer 228b with a constant thickness. A part of the metal contact 250 may directly contact the upper surface of the field insulating film 110.

The protruding area 215 of the semiconductor device 15 may be filled with the interlayer insulating film 270 or the metal contact 250, but the inventive concepts are not limited thereto.

Figure 18:
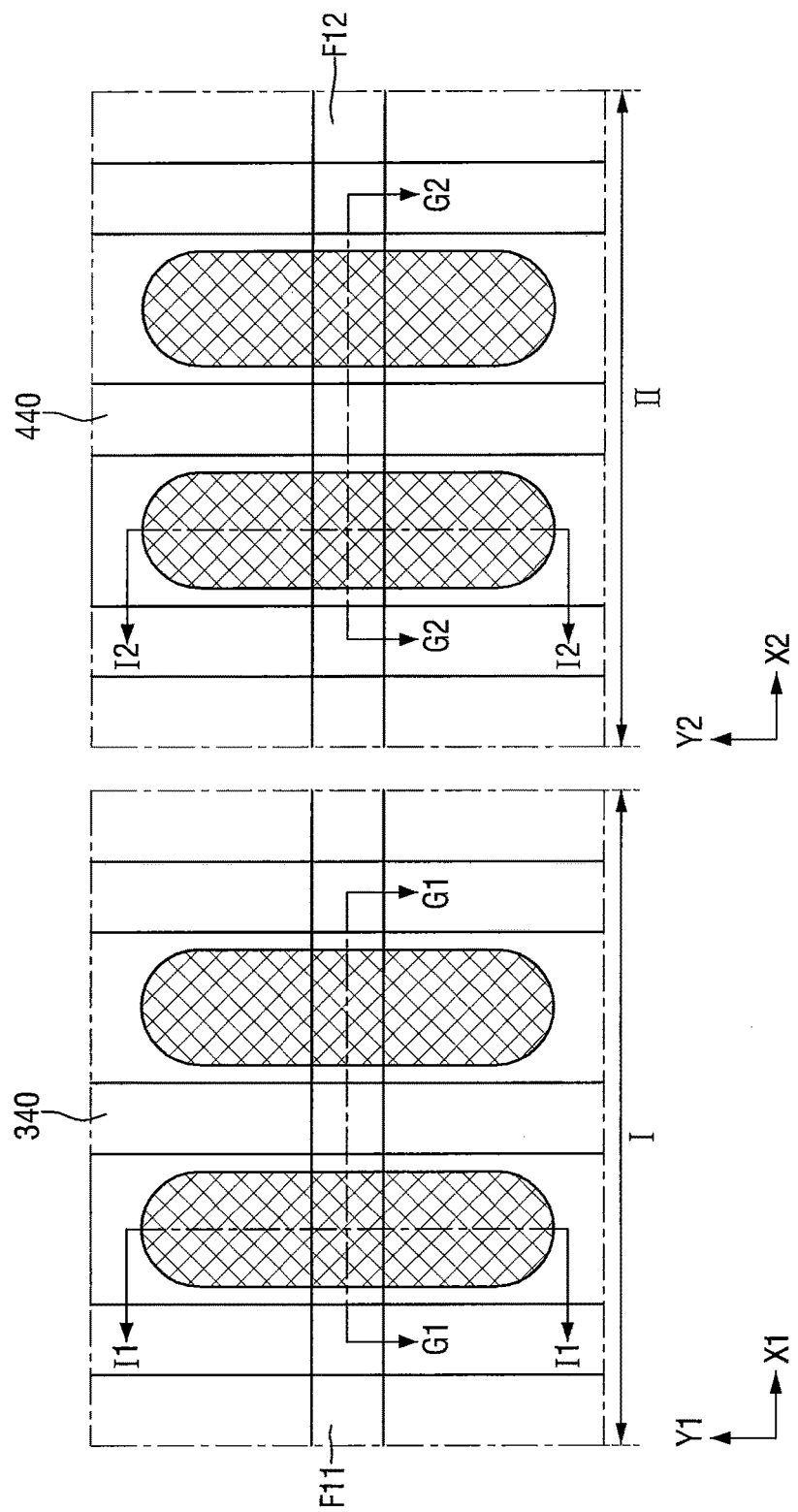
FIG. 18 is a layout diagram illustrating a semiconductor device according to still another embodiment of the inventive concepts.
Figure 19:
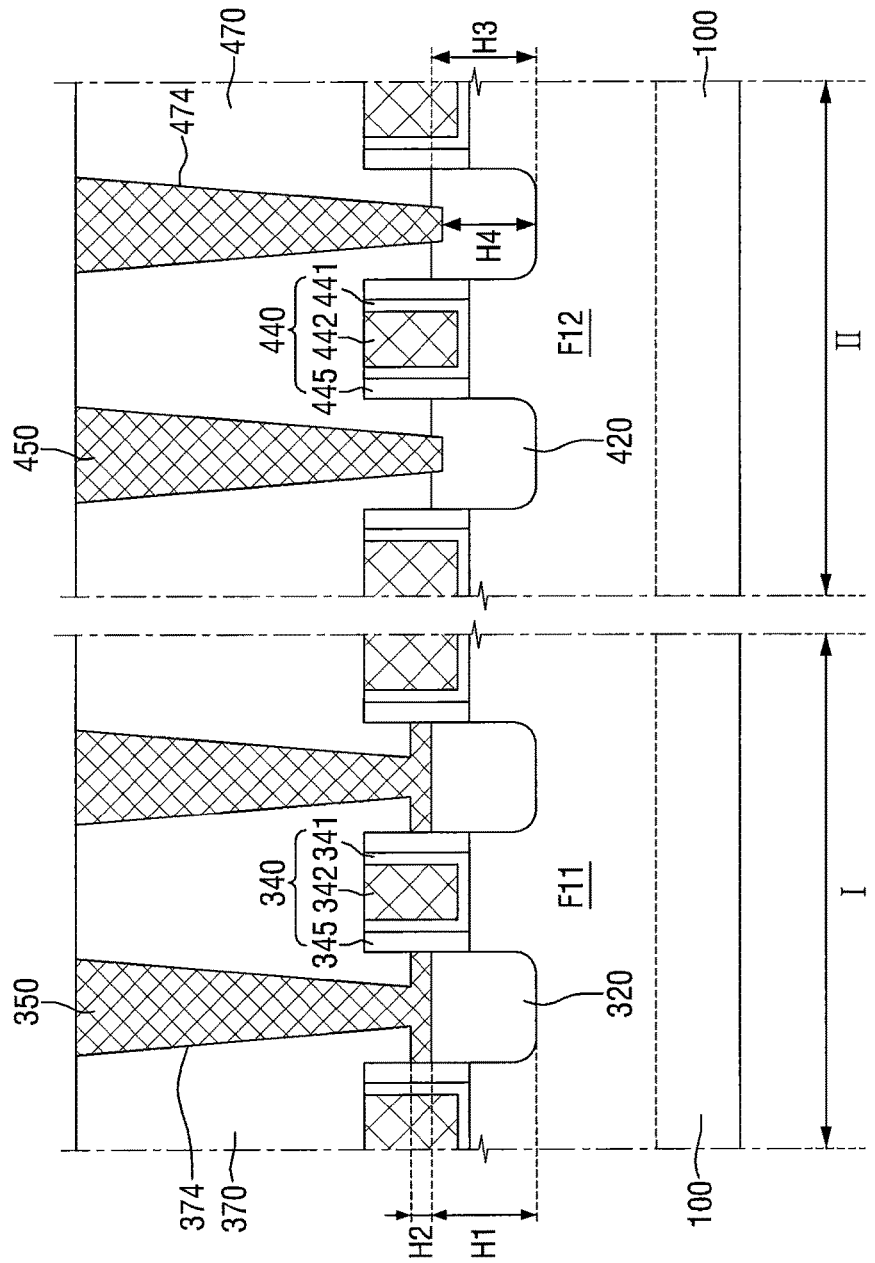
FIG. 19 is a cross-sectional view taken along lines G1-G1 and G2-G2 of the semiconductor device of FIG. 18.
Figure 20:
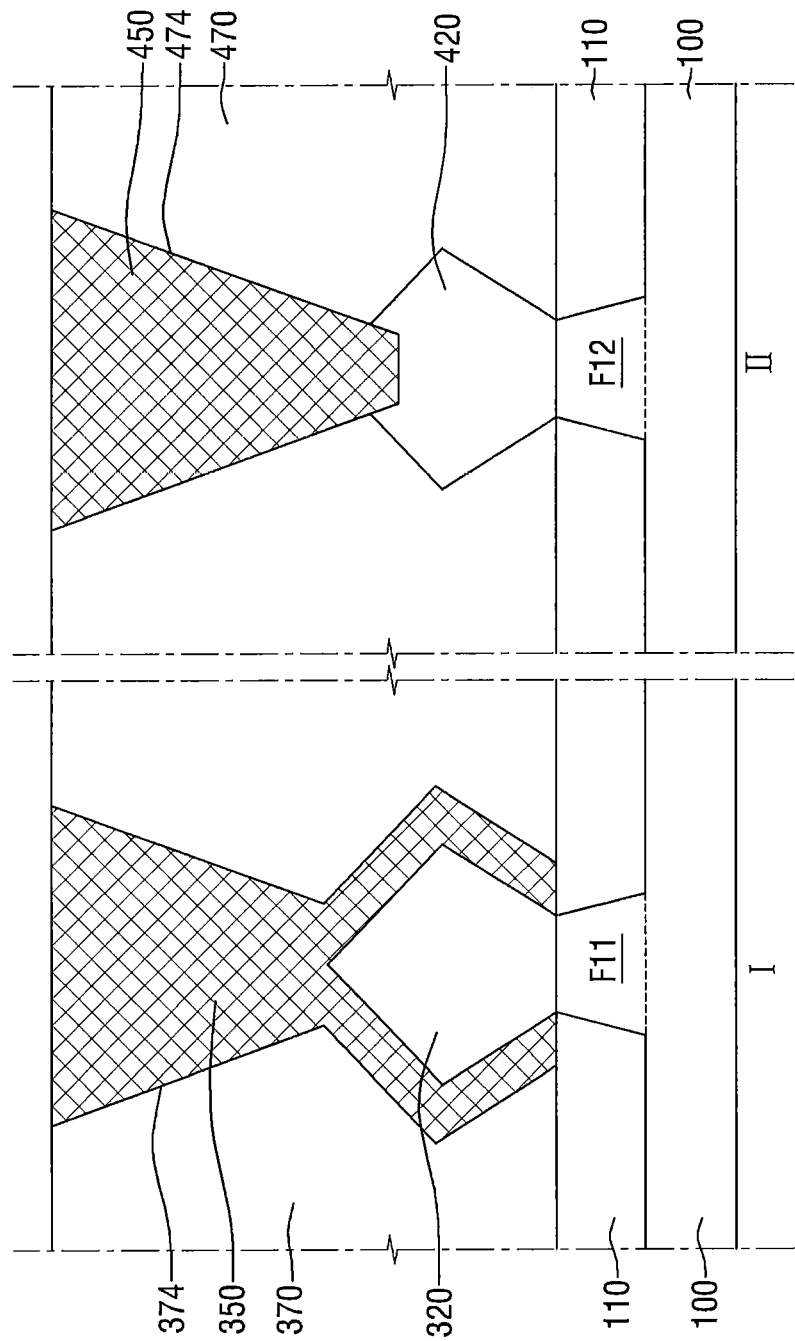
FIG. 20 is a cross-sectional view taken along lines I1-I1 and I2-I2 of the semiconductor device of FIG. 18.

FIG. 18 is a layout diagram illustrating a semiconductor device 21 according to still another embodiment of the inventive concepts. FIG. 19 is a cross-sectional view taken along lines G1-G1 and G2-G2 of the semiconductor device 21 of FIG. 18. FIG. 20 is a cross-sectional view taken along lines I1-I1 and I2-I2 of the semiconductor device 21 of FIG. 18.

Referring to FIGS. 18 to 20, a substrate 100 of the semiconductor device 21 may include a first area I and a second area II. The first area I and the second area II may be spaced apart from each other, and may be connected to each other.

By etching a part of the substrate 100, a first fin-type pattern F11 may be formed in the first area I of the substrate 100, and a second fin-type pattern F12 may be formed in the second area II of the substrate 100. The first fin-type pattern F11 may extend in the first direction X1, and the second fin-type pattern F12 may extend in the second direction X2. The first fin-type pattern F11 and the second fin-type pattern F12 may be a part of the substrate 100, and may include an epitaxial layer that is grown from the substrate 10Q.

The field insulating film 110 is formed on the first area I and the second area II of the substrate 100 and may be used for element isolation.

A first gate structure 340 may be formed on the first fin-type pattern F11 in a direction that intersects the first fin-type pattern F11. For example, the first gate structure 340 may extend along a third direction Y1 that intersects the first direction X1. The gate structure 340 may include a gate insulating film 341, a gate electrode 342, a spacer 345 and the like which are sequentially formed on the first fin-type pattern F11.

Similarly, the second gate structure 440 may be formed on the second fin-type pattern F12 in a direction that intersects the second fin-type pattern F12. For example, the second gate structure 440 may extend along a fourth direction Y2 that intersects the second direction X2. The gate structure 440 may include a gate insulating film 441, a gate electrode 442, a spacer 445 and the like which are sequentially formed on the second fin-type pattern F12.

A first epitaxial layer 320 may be formed on the first fin-type pattern F11 on at least one side of the first gate structure 340. The first epitaxial layer 320 may be formed on both sides of the first gate structure 340. The first epitaxial layer 320 may directly contact the side surface of the spacer 345 of the first gate structure 340.

Similarly, the second epitaxial layer 420 may be formed on the second fin-type pattern F12 on at least one side of the second gate structure 440. The second epitaxial layer 420 may be formed on both sides of the second gate structure 440. The second epitaxial layer 420 may directly contact the side surface of the spacer 445 of the second gate structure 440.

The first epitaxial layer 320 and the second epitaxial layer 420 may include materials different from each other. However, the inventive concepts are not limited thereto.

The first interlayer insulating film 370 may be formed on the semiconductor substrate 100. The first interlayer insulating film 370 may be formed to cover the first gate structure 340 and the first epitaxial layer 320. However, the first interlayer insulating film 370 may be formed so as not to be in direct contact with the first epitaxial layer 320.

The first metal contact 350 may be formed to surround the outer circumferential surface of the first epitaxial layer 320. For example, referring to FIG. 20, the first metal contact 350 may completely surround the outer circumferential surface of the first epitaxial layer 320. A part of the first metal contact 350 may be in contact with the upper surface of the field insulating film 110. In addition, the first metal contact 350 may surround the first epitaxial layer 320 with a constant thickness. However, the inventive concepts are not limited thereto.

As the first metal contact 350 completely surrounds all but the bottom surface of the first epitaxial layer 320, the first interlayer insulating film 370 may be disposed so as to be spaced apart from the first epitaxial layer 320. The first metal contact 350 may be formed within the first trench 374 which penetrates the first interlayer insulating film 370. The first trench 374 may expose the outer circumferential surface of the first epitaxial layer 320 (i.e., all but the bottom surface of the first epitaxial layer 320 that contacts the first fin-type pattern F11). However, the inventive concepts are not limited thereto.

Similarly, the second interlayer insulating film 470 may be formed on the semiconductor substrate 100. The second interlayer insulating film 470 may cover the second gate structure 440 and the second epitaxial layer 420.

However, the second interlayer insulating film 470 may be in direct contact with a portion of the second epitaxial layer 420. A second trench 474 may be formed in the second interlayer insulating film 470, and the second trench 474 may expose only a part of the upper surface of the second epitaxial layer 420.

The second metal contact 450 may be formed on the second epitaxial layer 420 within the second trench 474. Specifically, referring to FIG. 20, the second metal contact 450 may be in contact with only the upper surface of the second epitaxial layer 420. A lowermost surface of the second metal contact 450 may be disposed on a plane different from an uppermost surface of the second epitaxial layer 420. This may occur, as a part of the upper part of the second epitaxial layer 420 is etched together in the process of formation of the second trench 474. Thus, the side walls of the second epitaxial layer 420 may be in contact with the second interlayer insulating film 470.

The first metal contact 350 and the second metal contact 450 may have different shapes. The first metal contact 350 may have substantially the same shape as the metal contact 150 of the semiconductor device 1a that is described above with reference to FIGS. 1 to 4. Accordingly, the first metal contact 350 may include a first portion which is in contact with the side walls of the first gate structure 340, and a second portion which is spaced apart from the side walls of the first gate structure 340 and is located above the first portion. At an interface between the first and second portions, the width of the first portion may be greater than the width of the second portion. The first portion and the second portion may include the same material and may be integrally formed.

In contrast, the second metal contact 450 may be formed so as to be spaced apart from the second gate structure 440. That is, the second metal contact 450 may not be in contact with the side walls of the second gate structure 440.

The first epitaxial layer 320 has a height of H1, the first portion of the first metal contact 350 which is in contact with the first epitaxial layer 320 has a height of H2. The second epitaxial layer 420 has a height of H3, and the second metal contact 450 may have a lowermost surface which is at a height H4 above the lower surface of the second epitaxial layer 420.

The first height H1 and the third height H3 may be the same. However, the inventive concepts are not limited thereto.

The height H4 may be smaller than the height H3. The lowermost surface of the second metal contact 450 may be lower in the device structure than the uppermost surface of the first epitaxial layer 320. The lowermost surface of the first metal contact 350 may be coplanar with the uppermost surface of the first epitaxial layer 320.

Referring to FIG. 20, the first metal contact 350 may directly contact the field insulating film 110, and the second metal contact 450 may not directly contact the field insulating film 110.

In some embodiments of the inventive concepts, the first area may include an NMOS transistor, and the second area II may include a PMOS transistor. For example, the first epitaxial layer 320 may include Si or SiC, and the second epitaxial layer 420 may include SiGe. However, the inventive concepts are not limited thereto.

In some embodiments of the inventive concepts, the first metal contact 350 and the second metal contact 450 may be made of the same material. However, the inventive concepts are not limited thereto.

Figure 21:
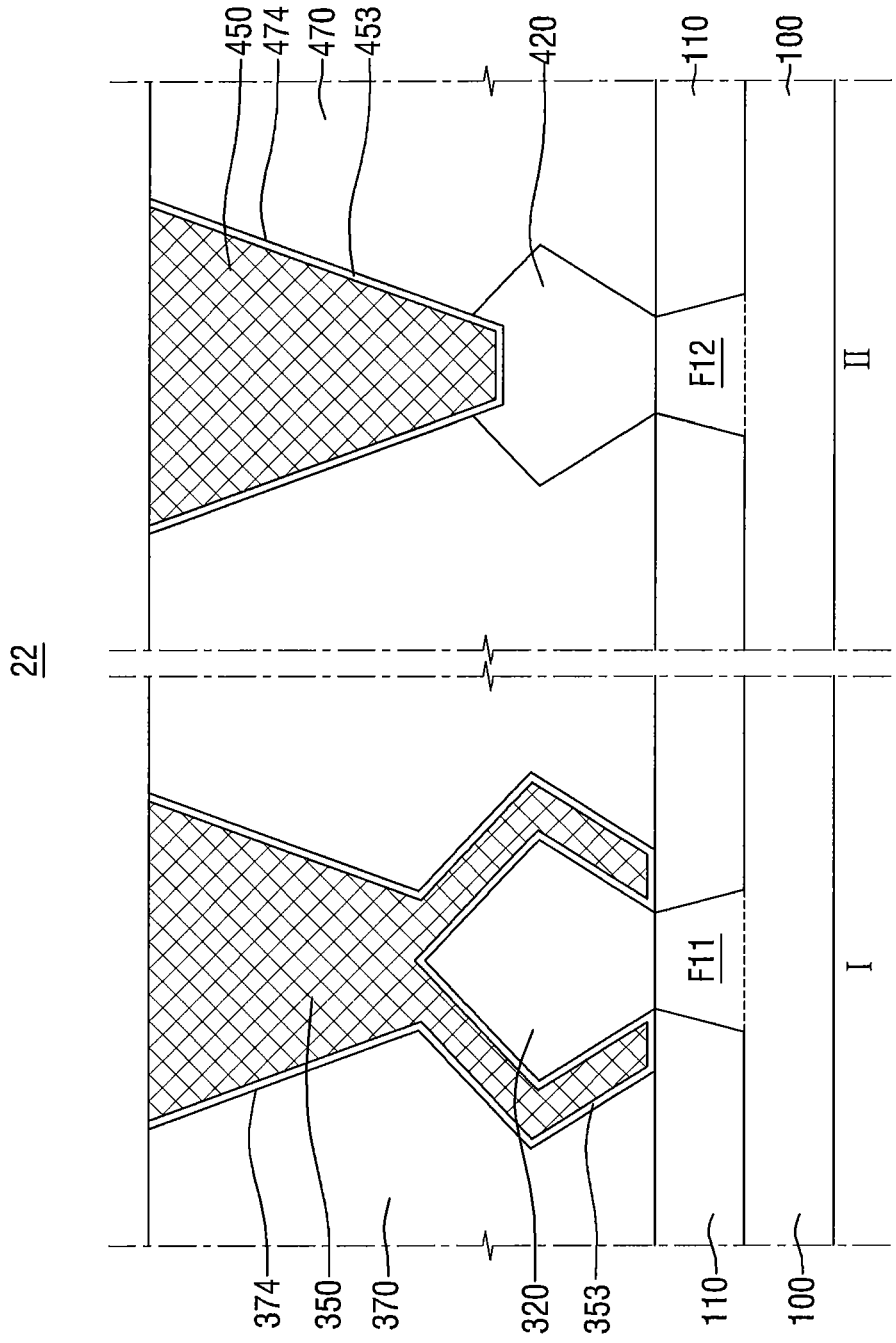
FIG. 21 is a cross-sectional view illustrating a semiconductor device according to still another embodiment of the inventive concepts.

FIG. 21 is a cross-sectional view illustrating a semiconductor device 22 according to still another embodiment of the inventive concepts. For convenience of description, hereinafter, repeated description of the same matters as in the aforementioned embodiment will be omitted, and the differences will mainly be described.

Referring to FIG. 21, the semiconductor device 22 may operate in substantially the same manner as the semiconductor device 21 that is described above with reference to FIGS. 18 to 20.

However, the semiconductor device 22 may further include a first barrier metal 353 and a second barrier metal 453.

The first barrier metal 353 may be formed on the inner surface of the first trench 374. Specifically, the first barrier metal 353 may be formed along both side surfaces of the first trench 374 and the outer circumferential surface of the first epitaxial layer 320. The first barrier metal 353 may be conformally formed along the inner surface of the first trench 374 with a constant thickness.

Similarly, the second barrier metal 453 may be formed on the inner surface of the second trench 474. Specifically, the second barrier metal 453 may be formed on both side surfaces of the second trench 474 and on only a part of the upper surface of the second epitaxial layer 420. The second barrier metal 453 may be conformally formed along the inner surface of the second trench 474 with a constant thickness.

The area of the first barrier metal 353 may be greater than the area of the second barrier metal 453.

The first barrier metal 353 and the second barrier metal 453 may include the same material and may be formed in the same process. For example, the first barrier metal 353 and the second barrier metal 453 may contain titanium (Ti), titanium nitride (TiN) or tungsten nitride (WN), and may be formed using PVD, CVD or ILD method.

As the barrier metal is formed, the contact resistance between the metal contacts 350, 450 and the epitaxial layers 320, 420 may be further reduced, and the performance of the semiconductor device 22 may be improved.

Figure 22:
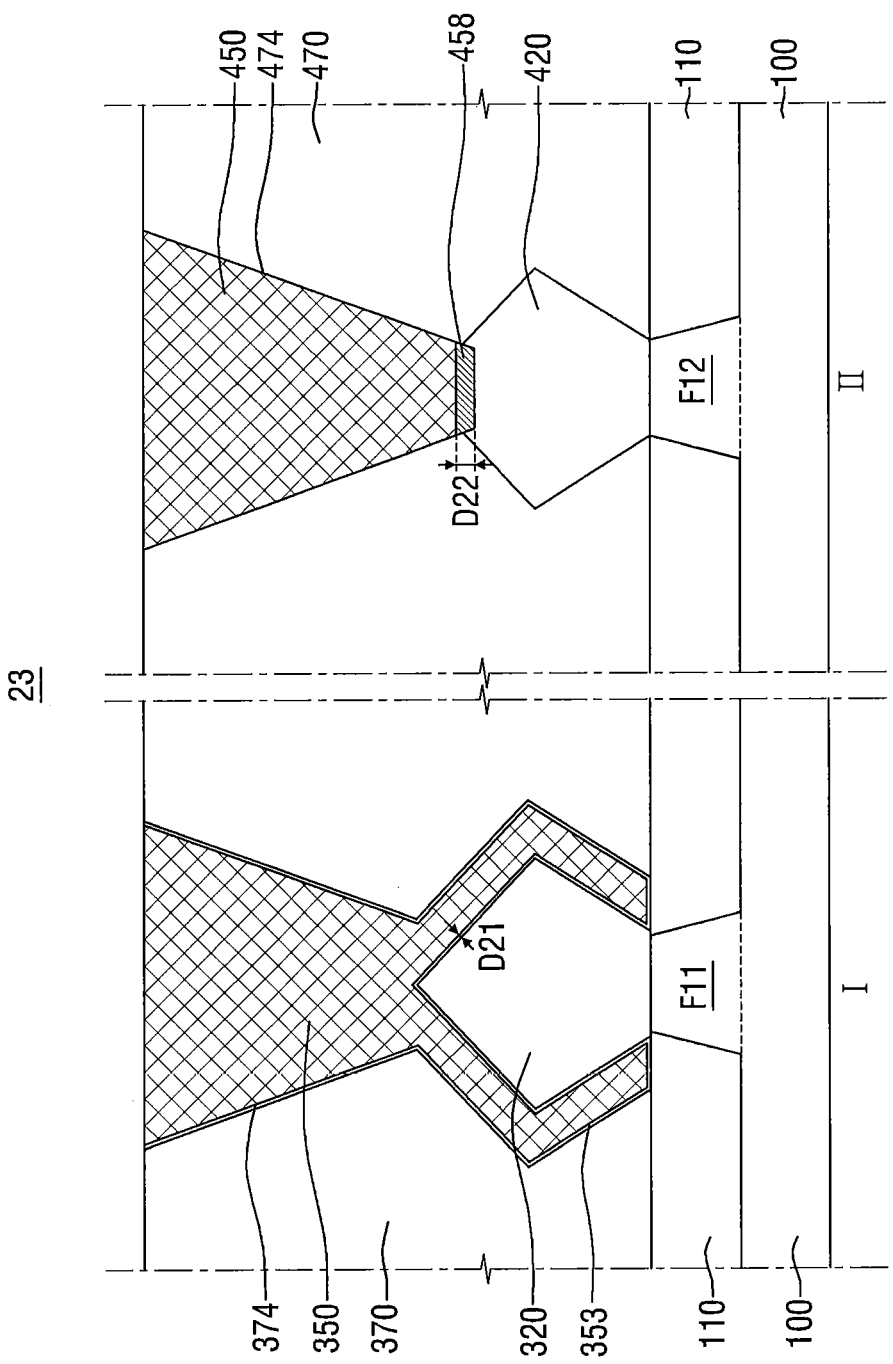
FIG. 22 is a cross-sectional view illustrating a semiconductor device according to still another embodiment of the inventive concepts.

FIG. 22 is a cross-sectional view illustrating a semiconductor device 23 according to still another embodiment of the inventive concepts. For convenience of description, hereinafter, repeated description of the same matters as in the aforementioned embodiment will be omitted, and the differences will mainly be described.

Referring to FIG. 22, the semiconductor device 23 may operate in substantially the same manner as the semiconductor device 21 that is described above with reference to FIGS. 18 to 20.

However, the semiconductor device 23 may further include a barrier metal 353 and a silicide layer 458.

The barrier metal 353 may be formed on the inner surface of the first trench 374. Specifically, the barrier metal 353 may be formed along both side surfaces of the first trench 374 and the outer circumferential surface of the first epitaxial layer 320. The barrier metal 353 may be conformally formed along the inner surface of the first trench 374 with a constant thickness. The barrier metal 353 disposed on the outer circumferential surface of the first epitaxial layer 320 may be naturally converted into silicide in the gap-fill process of the first metal contact 350.

Meanwhile, the silicide layer 458 may be formed on the inner surface of the second trench 474. Specifically, the silicide layer 458 may be formed on only a part of the upper surface of the second epitaxial layer 420.

The silicide layer 458 in the second trench 474 may contain Ti or Co. However, the inventive concepts are not limited thereto. The silicide layer 458 may be formed by depositing a metal layer on the second epitaxial layer 420 using a plating method, and by heat-treating the metal layer and causing the second epitaxial layer 420 and the metal layer to react with each other to form silicide. Electroless plating or electro-plating may be used depending on the type of metal deposited. The silicide layer 458 may be formed only on the exposed portion of the second epitaxial layer 420.

The thickness D22 of the silicide layer 458 may be thicker than the thickness D21 of the barrier metal 353. In addition, the material of the silicide layer 458 may be different from the material of the barrier metal 353 on the first epitaxial layer 320. However, the inventive concepts are not limited thereto.

Figure 23:
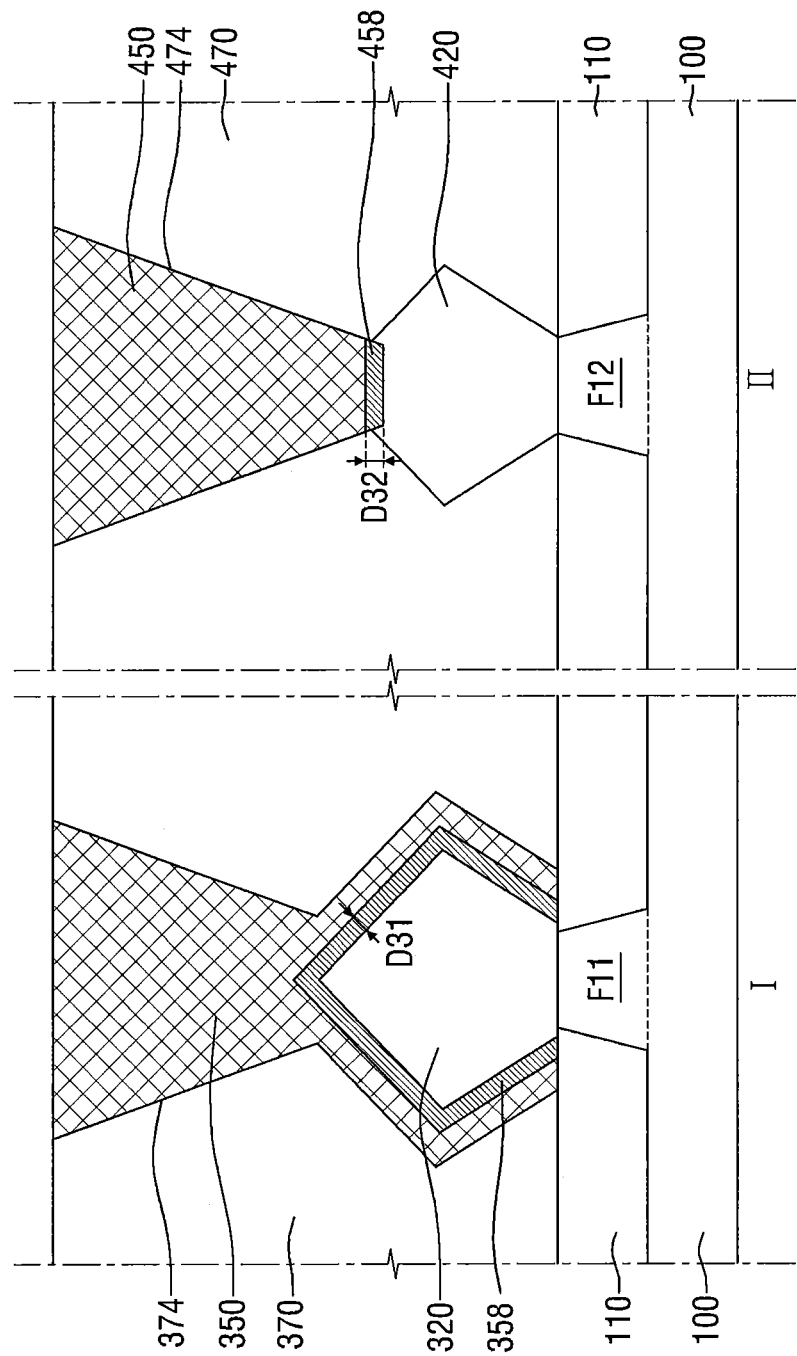
FIG. 23 is a cross-sectional view illustrating a semiconductor device according to still another embodiment of the inventive concepts.

FIG. 23 is a cross-sectional view illustrating a semiconductor device 24 according to still another embodiment of the inventive concepts. For convenience of description, hereinafter, repeated description of the same matters as in the aforementioned embodiment will be omitted, and the differences will mainly be described.

Referring to FIG. 23, the semiconductor device 24 may operate in substantially the same manner as the semiconductor device 21 that is described above with reference to FIGS. 18 to 20.

However, the semiconductor device 24 may further include a first silicide layer 358 and a second silicide layer 458.

The first silicide layer 358 may be formed on the inner surface of the first trench 374 along the outer circumferential surface of the first epitaxial layer 320. The first silicide layer 358 may be conformally formed along the outer surface of the first epitaxial layer 320 with a constant thickness.

Meanwhile, the second silicide layer 458 may be formed on the inner surface of the second trench 474. Specifically, the second silicide layer 458 may be formed only on a part of the upper surface of the second epitaxial layer 420. The area of the first silicide layer 358 may be larger than the area of the second silicide layer 458.

The first silicide layer 358 and the second silicide layer 458 may include the same material and may be formed in the same process. However, the first silicide layer 358 wraps around all the outer circumferential surface of the first epitaxial layer 320, and the second silicide layer 458 is formed only on a part of the second epitaxial layer 420.

The first silicide layer 358 and the second silicide layer 458 may be formed by depositing a metal layer on the first epitaxial layer 320 and the second epitaxial layer 420 using a plating method, and by heat-treating the metal layer and causing the first epitaxial layer 320 and the second epitaxial layer 420 to react with the metal layer to form silicide. For example, the first silicide layer 358 and the second silicide layer 458 may contain titanium (Ti), titanium nitride (TiN) or tungsten nitride (WN). A thickness D31 of the first silicide layer 358 may be the same as a thickness D32 of the second silicide layer 458. However, the inventive concepts are not limited thereto.

As the silicide layer is formed, the contact resistance between the metal contacts 350, 450 and the epitaxial layers 320, 420 may be reduced, and the performance of the semiconductor device may be improved.

Figure 24:
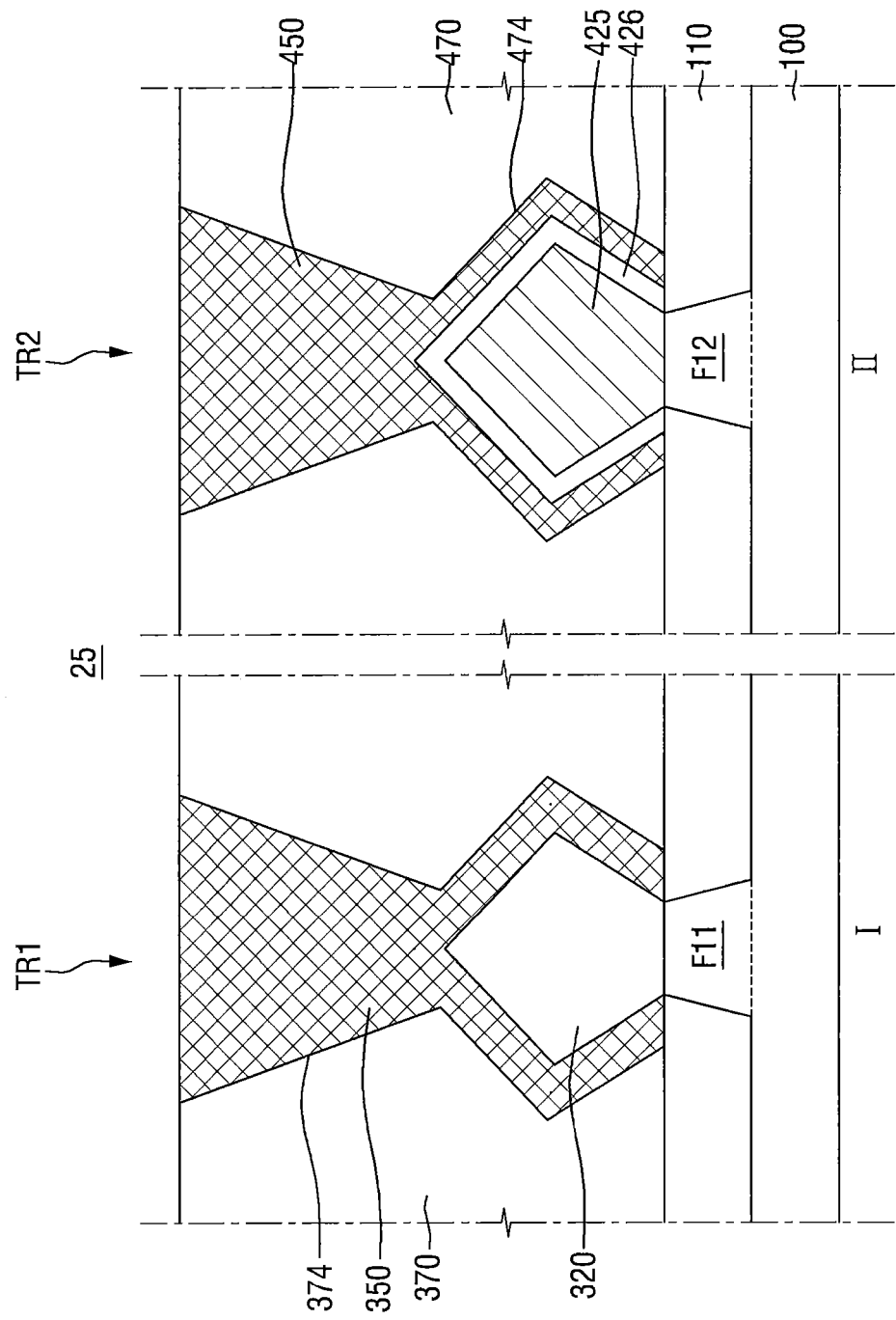
FIG. 24 is a cross-sectional view illustrating a semiconductor device according to still another embodiment of the inventive concepts.

FIG. 24 is a cross-sectional view illustrating a semiconductor device 25 according to still another embodiment of the inventive concepts. For convenience of description, hereinafter, repeated description of the same matters as in the aforementioned embodiment will be omitted, and the differences will mainly be described.

Referring to FIG. 24, a semiconductor device 25 may include a first transistor TR1 formed on the first area I, and a second transistor TR2 formed on the second area II. The first transistor TR1 may be substantially the same as the semiconductor device 1a of the inventive concepts that is described above with reference to FIGS. 1 to 4, and the second transistor TR2 may be substantially the same as the semiconductor device 3 that is described above with reference to FIG. 8.

For example, the first transistor TR1 may be operated as an NMOS transistor, and the second transistor TR2 may be operated as a PMOS transistor. The first epitaxial layer 320 included in the first transistor TR1 may contain Si and SiC, and the second epitaxial layer 420 included in the second transistor TR2 may contain SiGe. However, the inventive concepts are not limited thereto.

Figure 25:
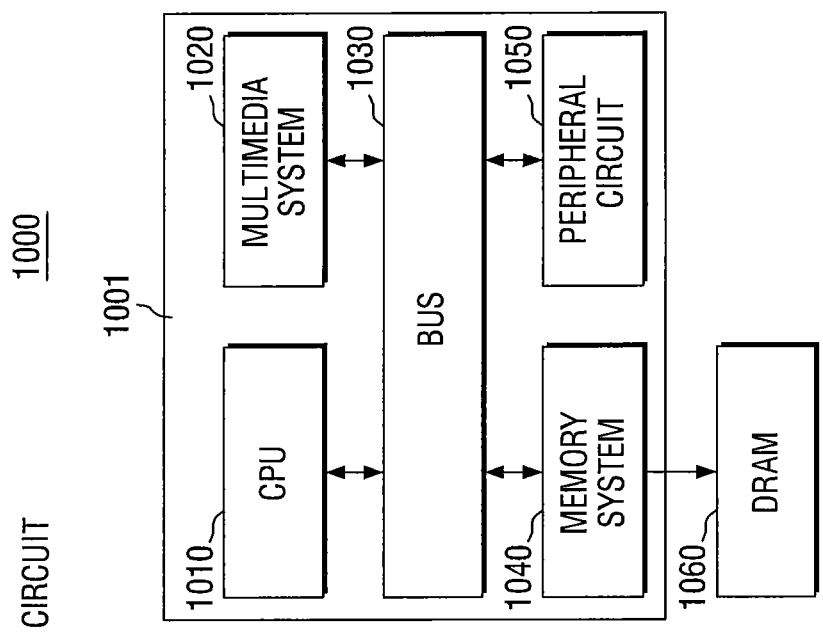
FIG. 25 is a block diagram of a SoC system including a semiconductor device according to embodiments of the inventive concepts.

FIG. 25 is a block diagram of a SoC system which includes a semiconductor device according to embodiments of the inventive concepts.

Referring to FIG. 25, a SoC system 1000 includes an application processor 1001, and a DRAM 1060.

The application processor 1001 may include a central processing unit 1010, a multimedia system 1020, a bus 1030, a memory system 1040 and a peripheral circuit 1050.

The central processing unit 1010 may perform the operations required for driving the SoC system 1000. In some embodiments of the inventive concepts, the central processing unit 1010 may be constituted by a multi-core environment that includes multiple cores.

The multimedia system 1020 may be used to perform various multimedia functions in the SoC system 1000. The multi-media system 1020 may include a 3D engine module, a video codec, a display system, a camera system, a post-processor and the like.

The bus 1030 may be used to perform the mutual data communication of the central processing unit 1010, the multimedia system 1020, the memory system 1040 and the peripheral circuit 1050. In some embodiments of the inventive concepts, the bus 1030 may have a multilayer structure. Specifically, as an example of the bus 1030, but not limited to, a multilayer advanced high-performance bus (AHB) or a multilayer advanced extensible interface (AXI) may be used.

The memory system 1040 may provide an environment needed for the application processor 1001 to be connected to an external memory (e.g., the DRAM 1060) and operate at high speed. In some embodiments of the inventive concepts, the memory system 1040 may include a separate controller (e.g., a DRAM controller) that controls the external memory (e.g., the DRAM 1060).

The peripheral circuit 1050 may provide an environment for the SoC system 1000 to smoothly connect to an external device (e.g., a mainboard). Accordingly, the peripheral circuit 1050 may include various interfaces that enable the external device connected to the SoC system 1000 to be compatible with the SoC system 1000.

The DRAM 1060 may function as an operating memory for the processor 1001. In some embodiments of the inventive concepts, the DRAM 1060 may be external to the application processor 1001 as illustrated. Specifically, the DRAM 1060 may be packaged with the application processor 1001 in the form of package on package (PoP).

As at least one of the components of the SoC system 1000, one of the semiconductor devices 1 to 5, 11 to 15 and 21 to 25 according to the above-described embodiments of the inventive concepts may be adopted.

FIGS. 26 to 29 are intermediate step diagrams illustrating a method of manufacturing a semiconductor device according to some embodiments of the inventive concepts. Hereinafter, a method of fabricating the semiconductor device 1a that is illustrated in FIGS. 1 to 4 will be described as an example. Also, for convenience of explanation, hereinafter, repeated description of the same matters as in the above-described embodiment will be omitted.

Figure 26:
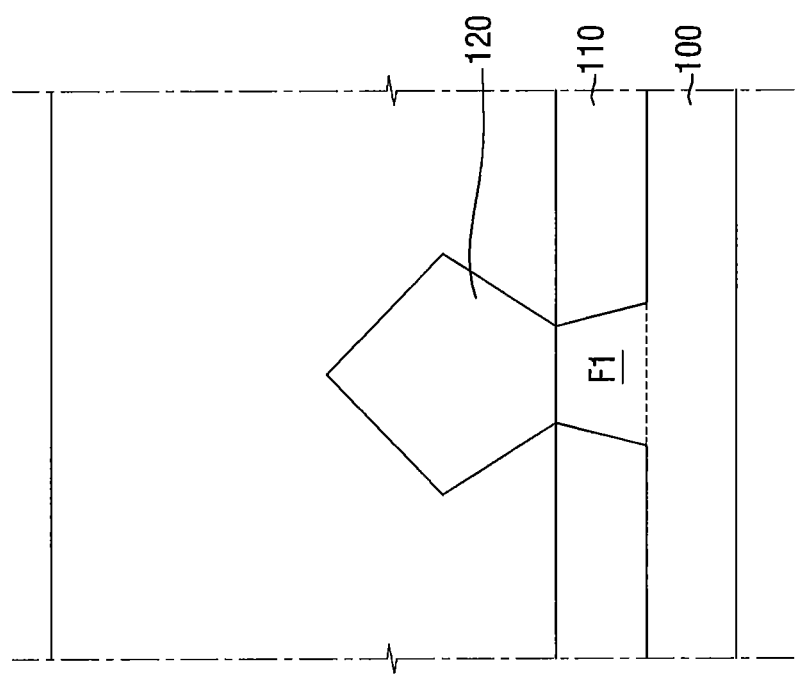
FIGS. 26 to 29 are intermediate step diagrams illustrating a method of manufacturing a semiconductor device according to some embodiments of the inventive concepts.

First, referring to FIG. 26, the first fin-type pattern F1 is formed on the substrate 100.

Specifically, after forming a mask pattern on the substrate 100, an etching process is performed to form the first fin-type pattern F1. The first fin-type pattern F1 may extend along the first direction (e.g., X1). Subsequently, the field insulating film 110 is formed on the upper surface of the substrate 100 and on sidewalls of the first fin-type pattern F1. The field insulating film 110 may be formed of a material which includes at least one of a silicon oxide film, a silicon nitride film and a silicon oxynitride film.

Subsequently, the first epitaxial layer 120 is formed on the first fin-type pattern F1. The first epitaxial layer 120 may be formed by an epitaxial process. The material of the first epitaxial layer 120 may differ, depending on whether the semiconductor device 1a is an NMOS transistor or a PMOS transistor. An impurity may be doped in situ during the epitaxial process. The first epitaxial layer 120 may have, for example, at least one of a diamond shape, a circular shape and a rectangular shape.

Figure 27:
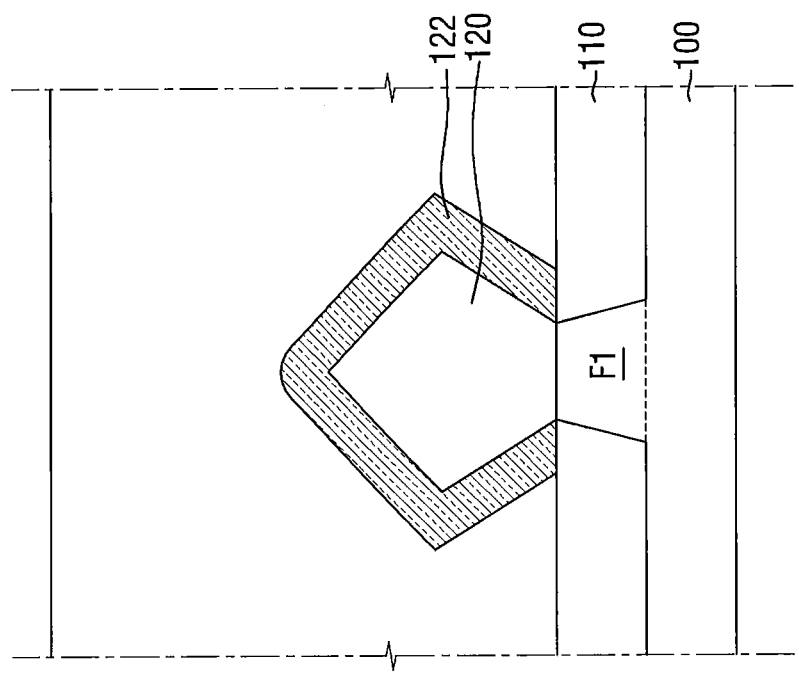

Subsequently, referring to FIG. 27, a dummy epitaxial layer 122 is formed on the first epitaxial layer 120. The dummy epitaxial layer 122 may be formed by an epitaxial process. The dummy epitaxial layer 122 may comprise a material that is different from the material of the first epitaxial layer 120. For example, when the semiconductor device 1a is an NMOS transistor, the first epitaxial layer 120 may contain Si or SiC, and the dummy epitaxial layer 122 may contain SiGe. However, the inventive concepts are not limited thereto. The dummy epitaxial layer 122 may be formed to have a constant thickness.

Figure 28:
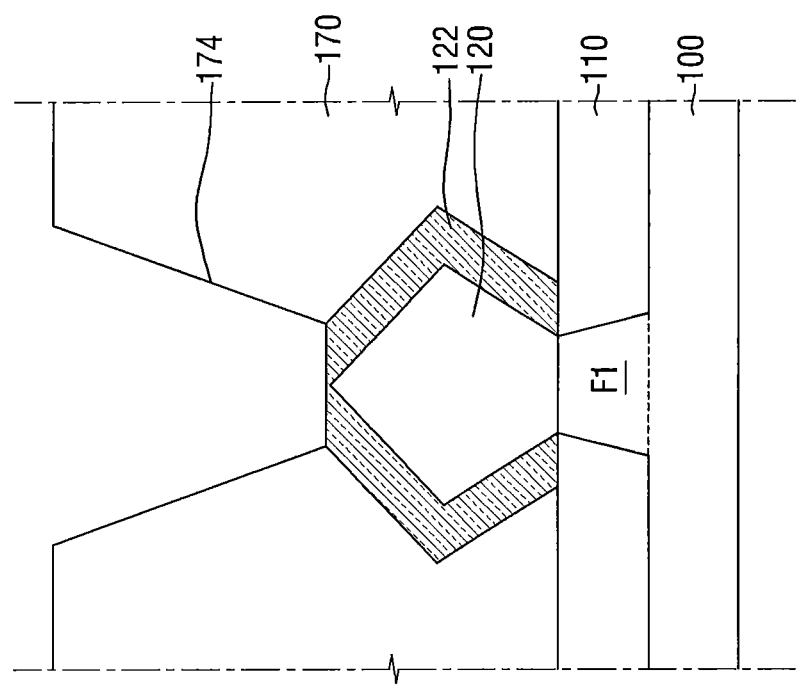

Subsequently, referring to FIG. 28, an interlayer insulating film 170 is formed. The interlayer insulating film 170 may be, for example, at least one of an oxide film, a nitride film and an oxynitride film.

Subsequently, a first trench 174 which penetrates the interlayer insulating film 170 is formed so that at least a part of the dummy epitaxial layer 122 is exposed. The first trench 174 may only expose the upper surface of the dummy epitaxial layer 122, and may not expose the first epitaxial layer 120.

Figure 29:
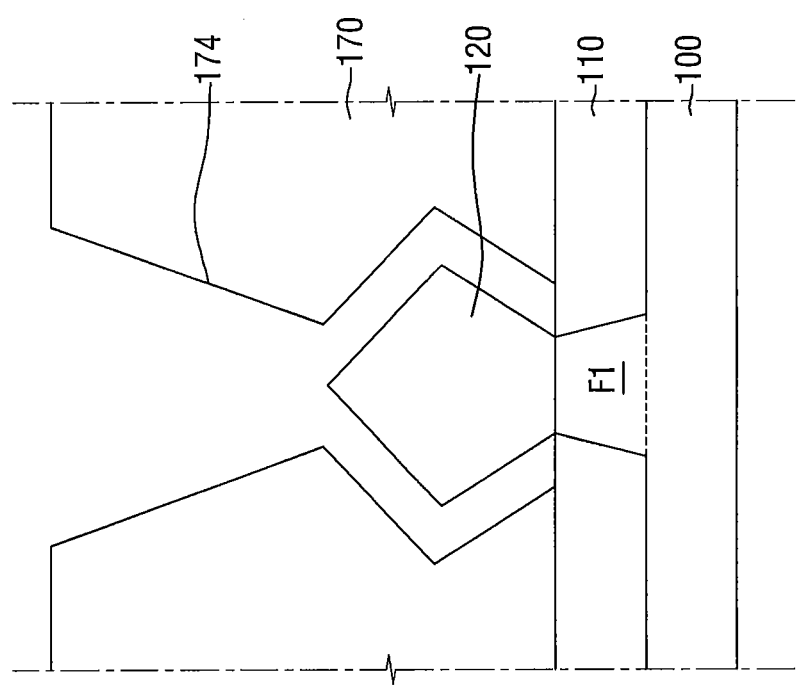

Subsequently, referring to FIG. 29, the dummy epitaxial layer 122 is etched using an etching gas or etchant that has an etching selectivity with respect to the first epitaxial layer 120. Dry etching or wet etching may be used in the etching process of the dummy epitaxial layer 122. Through this process, the first trench 174 which exposes the outer circumferential surface of the first epitaxial layer 120 may be formed. The first trench 174 may expose a part of the upper surface of the field insulating film 110.

For reference, although it is not illustrated in the drawings, in some embodiments of the inventive concepts, the dummy epitaxial layer 122 may remain in the lower part of the first trench 174.

Subsequently, referring to FIG. 2, the metal contact 150 may be formed, by gap-filling a space 172 between the interlayer insulating film 170 and the first epitaxial layer 120 using a metal material. The metal contact 150 may be formed to surround the outer circumferential surface of the first epitaxial layer 120. A part of the metal contact 150 may be in contact with the upper surface of the field insulating film 110. Further, the metal contact 150 may surround the first epitaxial layer 120 with a constant thickness. For example, the thickness D1 of the metal contact 150 which wraps around the lower part of the first epitaxial layer 120 may be substantially the same as the thickness D2 of the metal contact 150 which wraps around the upper part of the second epitaxial layer 126.

Subsequently, the upper surfaces of the interlayer insulating film 170 and the metal contact 150 may be aligned through a planarization process (e.g., CMP process). However, the inventive concepts are not limited thereto.

Additionally, although it is not illustrated in the drawings, in some embodiments of the inventive concepts, a barrier metal may be formed on the interlayer insulating film 170 and the first epitaxial layer 120 after etching the dummy epitaxial layer 122, and before forming the metal contact 150.

Moreover, in other embodiments of the inventive concepts, a second epitaxial layer which surrounds the first epitaxial layer 120 may be formed after forming the first epitaxial layer 120 and before the dummy epitaxial layer 122 is formed.

FIGS. 30 to 33 are intermediate step diagrams illustrating a method of manufacturing a semiconductor device according to some embodiments of the inventive concepts. Hereinafter, the semiconductor device 21 illustrated in FIGS. 18 to 20 will be described as an example. For convenience, hereinafter repeated description of the same matters as in the above-described embodiments will be omitted.

Figure 30:
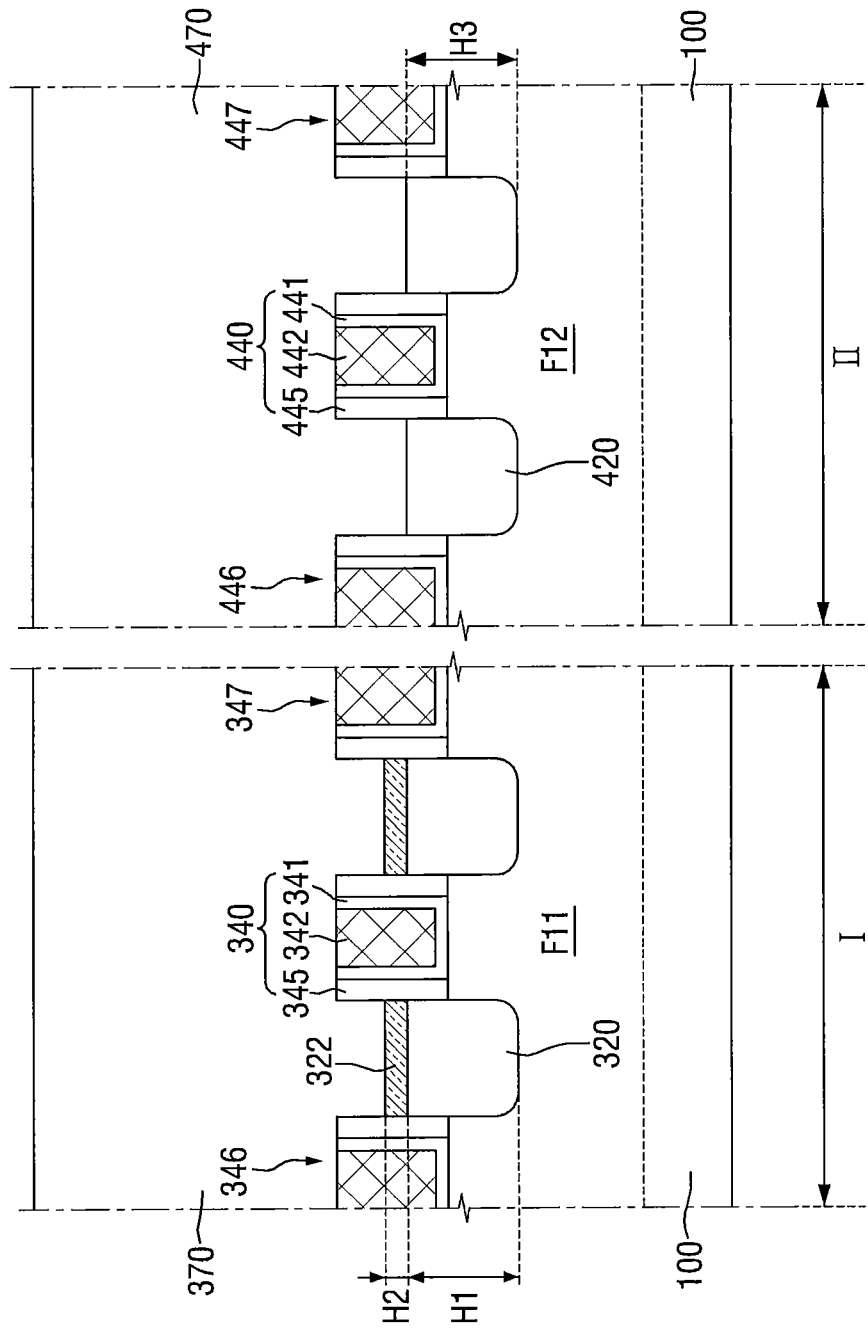
FIGS. 30 to 33 are intermediate step diagrams illustrating a method of manufacturing the semiconductor device according to some embodiments of the inventive concepts.

First referring to FIG. 30, a first fin-type pattern F11 that extends in the first direction X1 is formed in a first area I on a substrate 100 as is a first gate structure 340 that intersects the first fin-type pattern F11, and a second fin-type pattern F12 that extends in the second direction X2 is formed in a second area II on the substrate 100 as is a second gate structure 440 that intersects the second fin-type pattern F12.

In some embodiments of the inventive concepts, the first area I may include an NMOS transistor, and the second area II may include a PMOS transistor. For example, the first epitaxial layer 120 may contain Si or SiC, and the second epitaxial layer 126 may contain SiGe. However, the inventive concepts are not limited thereto.

Subsequently, the first epitaxial layer 320 is grown on the first fin-type pattern F11 on at least one side of the first gate structure 340, and the second epitaxial layer 420 is grown on the second fin-type pattern F12 on at least one side of the second gate structure 440. The first epitaxial layer 320 may include a material that is different from the second epitaxial layer 420. The upper surface of the first epitaxial layer 320 and the upper surface of the second epitaxial layer 420 may be coplanar, although the inventive concepts are not limited thereto.

Subsequently, a dummy epitaxial layer 322 which covers the outer surface of the first epitaxial layer 320 is grown on the first epitaxial layer 320. Subsequently, a first interlayer insulating film 370 which covers the first area I and a second interlayer insulating film 470 which covers the second area II are formed.

Figure 31:
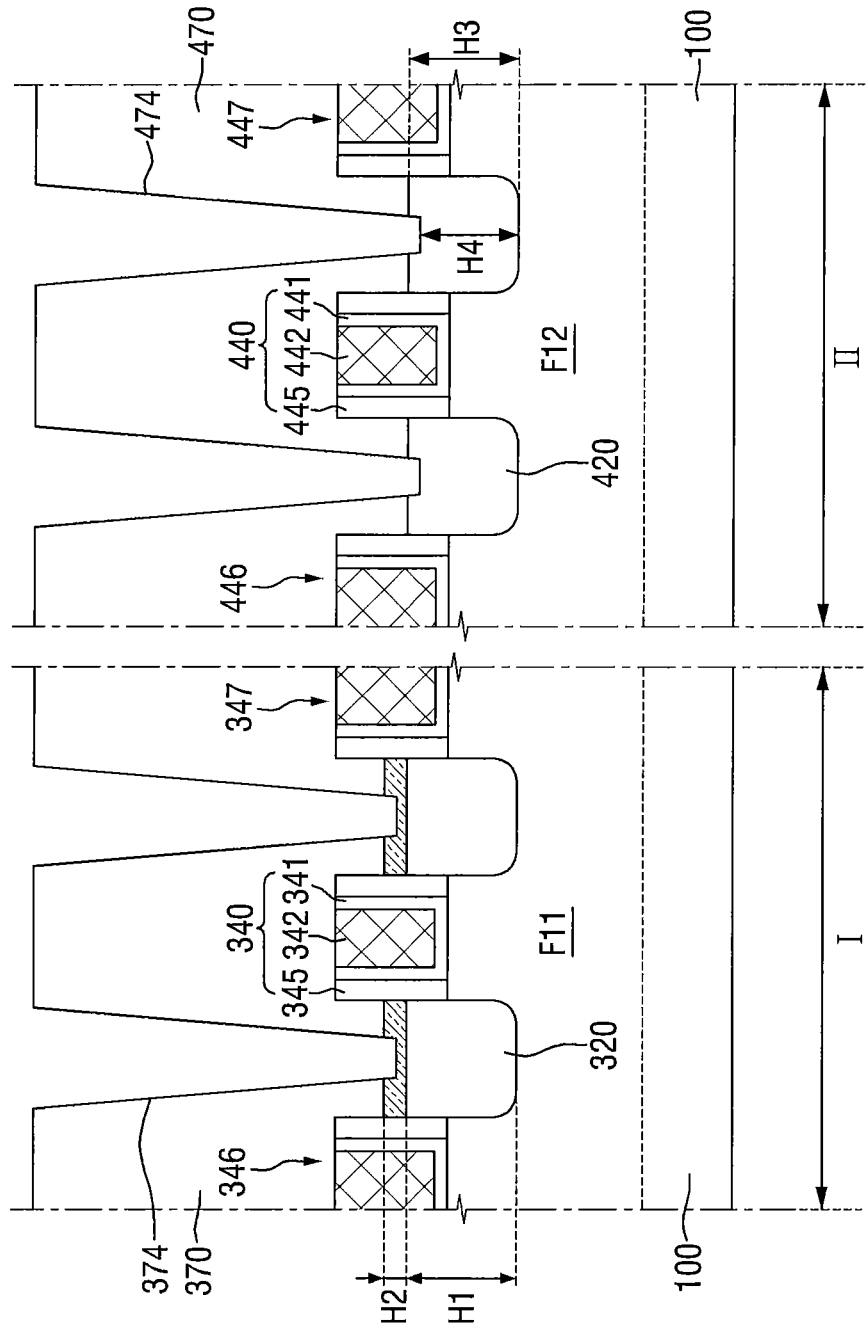

Subsequently, referring to FIG. 31, a first trench 374 which exposes at least a part of the dummy epitaxial layer 322, and a second trench 474 which exposes a part of the second epitaxial layer 420 are formed.

Since the second trench 474 penetrates a part of the second epitaxial layer 420, the lower surface of the second trench 474 may be formed lower than the uppermost surface of the second epitaxial layer 420. The first trench 374 may expose only a part of the dummy epitaxial layer 322.

Figure 32:
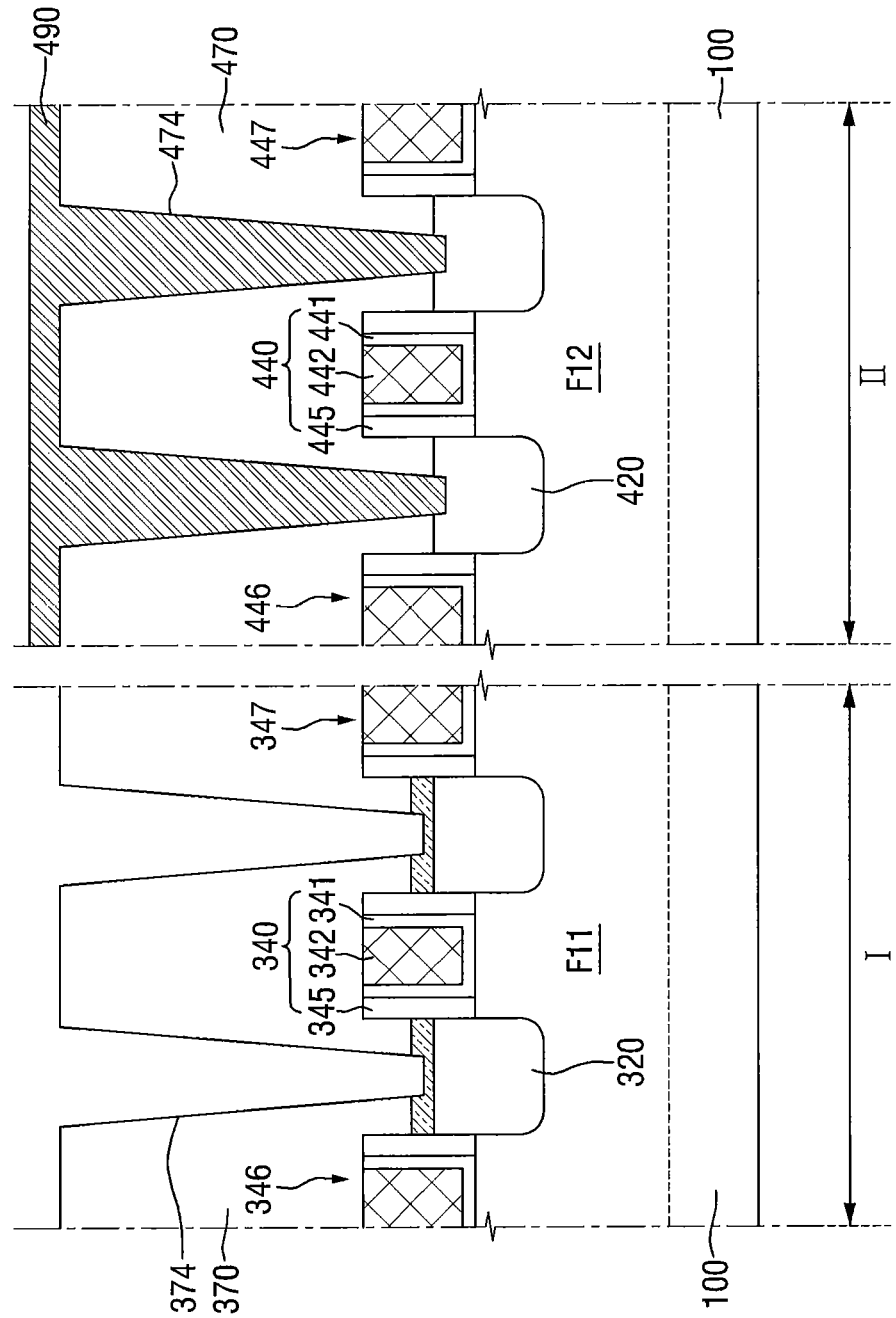
Figure 33:
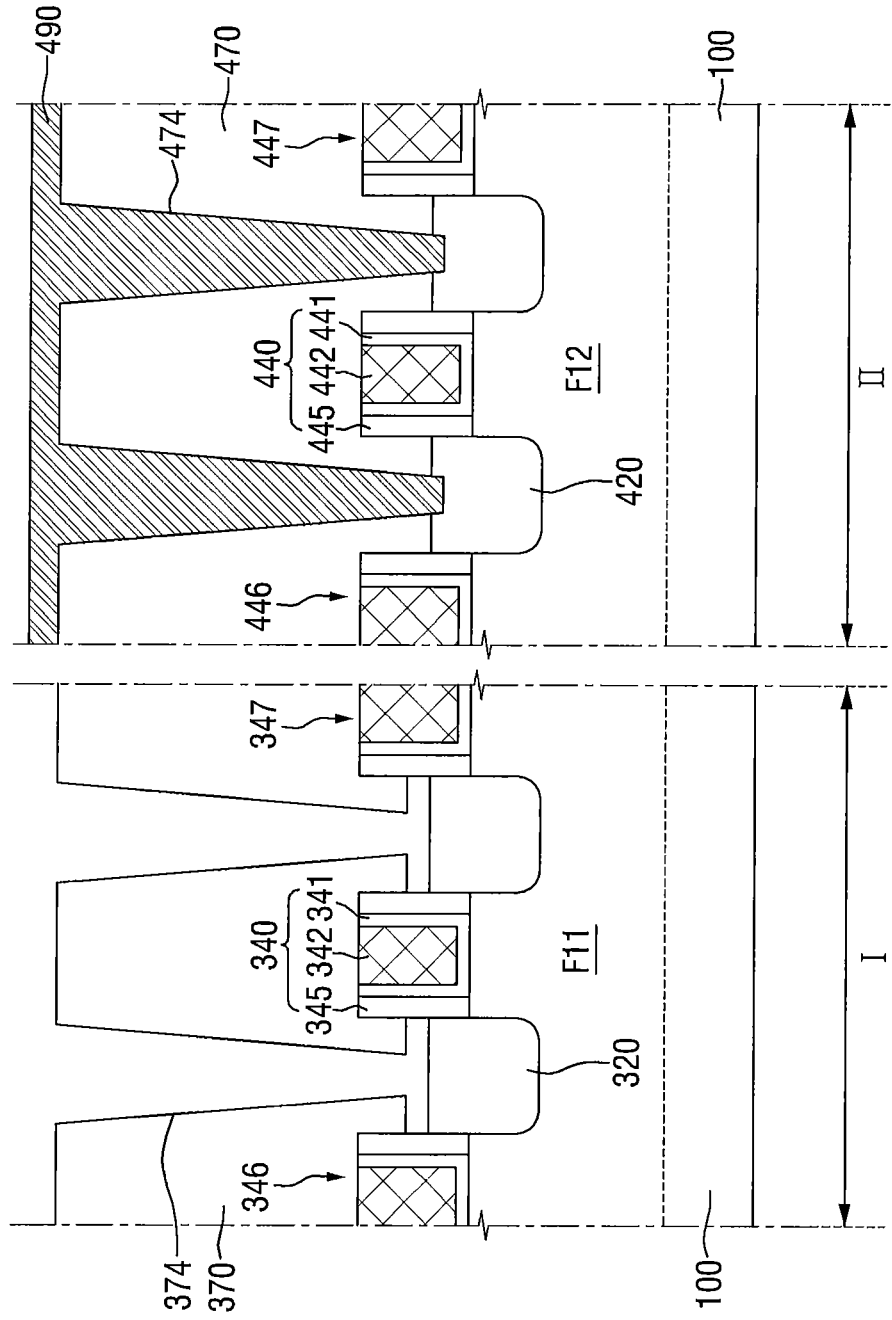

Subsequently, referring to FIG. 32, a first photoresist film 490 which covers the second area II is formed. Subsequently, referring to FIG. 33, the dummy epitaxial layer 322 is etched, using an etching gas or an etchant having an etching selectivity with respect to the first epitaxial layer 320.

Subsequently, referring to FIG. 19, the first photoresist film 490 is removed, and a first metal contact 350 which fills up a space between the first interlayer insulating film 370 and the first epitaxial layer 320, and a second metal contact 450 which fills up the second trench 474 are formed. At this time, the first metal contact 350 completely surrounds the outer circumferential surface of the first epitaxial layer 320, and the second metal contact 450 may be in contact with only a part of the upper surface of the second epitaxial layer 420.

Furthermore, although it is not illustrated in the drawings, in some embodiments of the inventive concepts, formation of a first barrier metal which completely surrounds the outer circumferential surface of the first epitaxial layer 320, and a second barrier metal located only above a part of the second epitaxial layer 420 may be further included.

Further, although it is not clearly illustrated in the drawing, formation of a second photoresist film which covers the first area I after removing the first photoresist film 490, and formation of a silicide layer on the top of the second epitaxial layer 420 may be further included. However, the inventive concepts are not limited thereto.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
   a substrate which includes a first area and a second area;
   a first fin-type pattern extending in a first direction on the first area;
   a second fin-type pattern extending in a second direction on the second area;
   a first gate structure which contacts the first fin-type pattern, the first gate structure extending in a third direction that intersects the first direction;
   a second gate structure which contacts the second fin-type pattern, the second gate structure extending in a fourth direction that intersects the second direction;
   a first epitaxial layer on the first fin-type pattern directly adjacent the first gate structure;
   a second epitaxial layer on the second fin-type pattern directly adjacent the second gate structure;
   a first metal contact which is on the first epitaxial layer and includes a first metal material; and
   a second metal contact which is on the second epitaxial layer and includes the first metal material,
   wherein the first metal contact completely surrounds an outer circumferential surface of the first epitaxial layer, the second metal contact does not completely surround an outer circumferential surface of the second epitaxial layer, and
   wherein the first metal contact directly contacts the first gate structure and the second metal contact does not directly contact the second gate structure.

2. The semiconductor device of claim 1, wherein the first area comprises an NMOS transistor, and the second area comprises a PMOS transistor.

3. The semiconductor device of claim 1, wherein the lowermost surface of the first metal contact is coplanar with the lowermost surface of the first epitaxial layer.

4. The semiconductor device of claim 1, further comprising:
   a first silicide layer which completely covers the outer circumferential surface of the first epitaxial layer; and
   a second silicide layer which is located only at a top of the second epitaxial layer,
   wherein the first and second silicide layers have same thicknesses.

5. The semiconductor device of claim 4, wherein the first silicide layer comprises a composition same as the second silicide layer.

6. The semiconductor device of claim 1, wherein an upper surface of the second epitaxial layer includes a recess and the second metal contact extends into the recess.

7. The semiconductor device of claim 1, wherein the first and second metal contacts are each monolithic contacts.

8. The semiconductor device of claim 1, wherein the first epitaxial layer includes a first type of semiconductor material and the second epitaxial layer includes a second type of semiconductor material that is different from the first type of semiconductor material.

9. A semiconductor device comprising:
   a substrate which includes a first area and a second area;
   a first fin-type pattern extending in a first direction on the first area;
   a second fin-type pattern extending in a second direction on the second area;
   a first gate structure which is in contact with the first fin-type pattern and extends to intersect the first direction;
   a second gate structure which is in contact with the second fin-type pattern and extends to intersect the second direction;
   a first epitaxial layer on the first fin-type pattern on at least one side of the first gate structure;
   a second epitaxial layer on the second fin-type pattern on at least one side of the second gate structure;
   a first metal contact which is on the first epitaxial layer and includes a metal; and
   a second metal contact which is on the second epitaxial layer and includes a metal,
   wherein the first metal contact includes a first portion which contacts side walls of the first gate structure, and a second portion which is spaced apart from the side walls of the first gate structure on top of the first portion,
   wherein an upper surface of the second epitaxial layer includes a recess and the second metal contact extends into the recess, wherein the first metal contact completely surrounds an outer circumferential surface of the first epitaxial layer, the second metal contact does not completely surround an outer circumferential surface of the second epitaxial layer and
   wherein the first metal contact directly contacts the first gate structure and the second metal contact does not directly contact the second gate structure.

10. The semiconductor device of claim 9, wherein the first gate structure comprises a gate insulating film, a first gate electrode on the gate insulating film, and a spacer on at least one side of the first gate electrode,
    wherein the first portion contacts the spacer, and
    the second portion does not contact the spacer, and
    wherein the first portion is in direct contact with the spacer or the first epitaxial layer.

11. The semiconductor device of claim 9, further comprising: an interlayer insulating film which covers the first gate structure and the first epitaxial layer, and wherein the interlayer insulating film does not contact the first epitaxial layer.

12. The semiconductor device of claim 9, wherein the first and second metal contacts are each monolithic contacts.

13. The semiconductor device of claim 12, wherein the first epitaxial layer includes a first type of semiconductor material and the second epitaxial layer includes a second type of semiconductor material that is different from the first type of semiconductor material.

14. A semiconductor device comprising:
    a substrate which includes a first area and a second area;
    a first fin-type pattern extending in a first direction on the first area;
    a second fin-type pattern extending in a second direction on the second area;
    a first gate structure which contacts the first fin-type pattern, the first gate structure extending in a third direction that intersects the first direction;
    a second gate structure which contacts the second fin-type pattern, the second gate structure extending in a fourth direction that intersects the second direction;

a first epitaxial layer on the first fin-type pattern directly adjacent the first gate structure;
a second epitaxial layer on the second fin-type pattern directly adjacent the second gate structure;
a first metal contact which is on the first epitaxial layer and includes a first metal material; and
a second metal contact which is on the second epitaxial layer and includes the first metal material,
wherein the first metal contact completely surrounds an outer circumferential surface of the first epitaxial layer,
wherein the second metal contact does not completely surround an outer circumferential surface of the second epitaxial layer,
wherein a first height (H1) of the first epitaxial layer above an upper surface of the substrate is the same as a third height (H3) of the second epitaxial layer above the upper surface of the substrate, and the lowermost surface of the second metal contact is at a fourth height (H4) above the upper surface of the substrate, wherein the fourth height (H4) is less than the first height (H1) and the third height (H3), and wherein the lowermost surface of the first metal contact that directly contacts the uppermost surface of the first epitaxial layer is above the lowermost surface of the second metal contact, and
wherein the first metal contact directly contacts the first gate structure and the second metal contact does not directly contact the second gate structure.

15. The semiconductor device of claim 14, wherein an upper surface of the second epitaxial layer includes a recess and the second metal contact extends into the recess.

16. The semiconductor device of claim 14, wherein the first and second metal contacts are each monolithic contacts.

17. The semiconductor device of claim 14, wherein the first epitaxial layer includes a first type of semiconductor material and the second epitaxial layer includes a second type of semiconductor material that is different from the first type of semiconductor material.

* * * * *